US012666914B2

(12) United States Patent
Kim et al.

(10) Patent No.: US 12,666,914 B2
(45) Date of Patent: Jun. 23, 2026

(54) SEMICONDUCTOR CARRIER STORAGE SYSTEM, SEMICONDUCTOR FABRICATION SYSTEM INCLUDING THE SAME, AND SEMICONDUCTOR FABRICATION METHOD USING THE SAME

(71) Applicant: Samsung Electronics Co., Ltd., Suwon-si (KR)

(72) Inventors: Youngwook Kim, Suwon-si (KR); Hyunjae Kang, Suwon-si (KR); Sangmin Kim, Suwon-si (KR); Chul-Jun Park, Suwon-si (KR); Yong-Jun Ahn, Suwon-si (KR); Sangkyung Lee, Suwon-si (KR); Hyunwoo Lee, Suwon-si (KR); Junhyuk Chang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 792 days.

(21) Appl. No.: 17/972,187

(22) Filed: Oct. 24, 2022

(65) Prior Publication Data

US 2023/0326777 A1 Oct. 12, 2023

(30) Foreign Application Priority Data

Apr. 11, 2022 (KR) ........................ 10-2022-0044582

(51) Int. Cl.
*H01L 21/677* (2006.01)
*B65G 47/91* (2006.01)
*H10P 72/30* (2026.01)

(52) U.S. Cl.
CPC .......... *H10P 72/3221* (2026.01); *B65G 47/91* (2013.01); *H10P 72/3206* (2026.01); *H10P 72/3214* (2026.01); *H10P 72/3216* (2026.01)

(58) Field of Classification Search
CPC ......... H01L 21/67733; H01L 21/67712; H01L 21/67724; H01L 21/67727;
(Continued)

(56) References Cited

U.S. PATENT DOCUMENTS 4,459,078 A * 7/1984 Chiantella ............ B65G 1/0414
414/284
9,412,631 B2 8/2016 Jang et al.
(Continued)

FOREIGN PATENT DOCUMENTS

EP 1446826 B1 6/2006
JP 6627699 B2 1/2020
(Continued)

*Primary Examiner* — Gerald McClain
(74) *Attorney, Agent, or Firm* — Fish & Richardson P.C.

(57) ABSTRACT

The semiconductor carrier storage system includes storage ports each of which accommodates a semiconductor carrier, a shuttle rail that extends in a horizontal direction on a side of the storage ports, an internal carrier shuttle that moves along the shuttle rail and transfers a semiconductor carrier to each of the storage ports, and an upper transfer port that receives the semiconductor carrier from an overhead hoist transport (OHT). The internal carrier shuttle includes a shuttle body coupled to the shuttle rail, a transfer wheel that connects the shuttle body to the shuttle rail, a gripper that holds the semiconductor carrier, and a hoist that vertically extends between the shuttle body and the gripper and drives the gripper to vertically move.

17 Claims, 19 Drawing Sheets

(58) Field of Classification Search
  CPC ......... H01L 21/67763; H01L 21/67766; H01L
      21/67769; H01L 21/67775; B65G 47/91;
      H10P 72/3221; H10P 72/3206; H10P
      72/3214; H10P 72/3216; H10P 72/34;
      H10P 72/3402; H10P 72/3404; H10P
      72/3408
  See application file for complete search history.

(56)                References Cited

U.S. PATENT DOCUMENTS

|  |  |  |  |  |
|---|---|---|---|---|
| 9,633,879 | B2 | 4/2017 | Ito et al. | |
| 10,453,724 | B2 | 10/2019 | Yoo et al. | |
| 10,497,596 | B2 | 12/2019 | Dovids et al. | |
| 10,564,632 | B2* | 2/2020 | Hsu ................... | H01L 21/67727 |
| 10,625,938 | B2 | 4/2020 | Horii et al. | |
| 11,239,102 | B2* | 2/2022 | Goto ................. | H01L 21/67724 |
| 2006/0188358 | A1* | 8/2006 | Bonora ............. | H01L 21/67736 |
| | | | | 414/217 |
| 2007/0128007 | A1* | 6/2007 | Bonora ............. | H01L 21/67775 |
| | | | | 414/217 |
| 2008/0021593 | A1* | 1/2008 | Yu ..................... | G05B 19/4189 |
| | | | | 700/228 |

| 2009/0022575 | A1* | 1/2009 | Tsuge ................ | H01L 21/67727 |
|---|---|---|---|---|
| | | | | 414/679 |
| 2011/0158776 | A1* | 6/2011 | Inui ................... | H01L 21/67769 |
| | | | | 414/277 |
| 2013/0230375 | A1* | 9/2013 | Tung ................. | H01L 21/67733 |
| | | | | 414/592 |
| 2014/0112741 | A1* | 4/2014 | Yoshioka .......... | H01L 21/67727 |
| | | | | 414/222.01 |
| 2016/0013087 | A1* | 1/2016 | Yoshioka .......... | H01L 21/67727 |
| | | | | 414/659 |
| 2016/0247702 | A1* | 8/2016 | Adachi ............. | H01L 21/67775 |
| 2020/0043758 | A1* | 2/2020 | Kuo .................. | H01L 21/67369 |
| 2020/0126823 | A1* | 4/2020 | Teramoto .......... | H01L 21/67769 |
| 2022/0037178 | A1* | 2/2022 | Kuo .................. | H01L 21/67769 |
| 2022/0073275 | A1* | 3/2022 | Wada ................. | H01L 21/6773 |
| 2023/0080991 | A1* | 3/2023 | Choi ................. | H01L 21/67196 |
| | | | | 414/751.1 |
| 2023/0395415 | A1* | 12/2023 | Hsu ................... | H01L 21/67736 |
| 2024/0021456 | A1* | 1/2024 | Hsu ................... | H01L 21/67733 |
| 2024/0327136 | A1* | 10/2024 | Lee ................... | H01L 21/67769 |

FOREIGN PATENT DOCUMENTS

| KR | 10-1434951 | B1 | 8/2014 |
|---|---|---|---|
| KR | 20210092269 | A | 7/2021 |
| KR | 20220041392 | A | 4/2022 |

* cited by examiner

SEMICONDUCTOR CARRIER STORAGE SYSTEM, SEMICONDUCTOR FABRICATION SYSTEM INCLUDING THE SAME, AND SEMICONDUCTOR FABRICATION METHOD USING THE SAME

CROSS-REFERENCE TO RELATED APPLICATION

This U.S. nonprovisional application claims priority under 35 U.S.C § 119 to Korean Patent Application No. 10-2022-0044582 filed on Apr. 11, 2022 in the Korean Intellectual Property Office, the disclosure of which is hereby incorporated by reference in its entirety.

BACKGROUND

Inventive concepts relate to a semiconductor carrier storage system, a semiconductor fabrication system including the same, and/or a semiconductor fabrication method using the same, and more particularly, to a semiconductor carrier storage system capable of increasing space usability, a semiconductor fabrication system including the same, and/or a semiconductor fabrication method.

Various processes may be performed to fabricate a semiconductor device. For example, a semiconductor device may be fabricated by performing, on a semiconductor wafer, an exposure process, a deposition process, and an etching process. In such various processes, it may be required or desired that a semiconductor device be transferred from a certain apparatus to another apparatus. The delivery of semiconductor devices may use an automated guided vehicle (AGV) and/or an overhead hoist transport (OHT). The overhead hoist transport (OHT) may convey semiconductor devices while moving along a rail installed on a ceiling over semiconductor equipment. A semiconductor carrier may be used to transfer semiconductor devices. The semiconductor carrier may be required or desired to be kept and utilized for a certain time.

SUMMARY

Some example embodiments of inventive concepts provide a semiconductor carrier storage system capable of storing a semiconductor carrier by utilizing variously shaped idle spaces in a semiconductor fabrication line, a semiconductor fabrication system including the same, and a semiconductor fabrication method using the same.

Alternatively or additionally, some example embodiments of inventive concepts provide a semiconductor carrier storage system capable of picking up and storing a semiconductor carrier that is transferred along various pathways, a semiconductor fabrication system including the same, and/or a semiconductor fabrication method using the same.

Some example embodiments of inventive concepts provide a semiconductor carrier storage system capable of reducing costs, a semiconductor fabrication system including the same, and/or a semiconductor fabrication method using the same.

Alternatively or additionally, some example embodiments of inventive concepts provide a semiconductor carrier storage system capable of storing a great number of semiconductor carriers while reducing a time required for or used for transferring a semiconductor carrier, a semiconductor fabrication system including the same, and/or a semiconductor fabrication method using the same.

The object of inventive concepts is not limited to the mentioned above, and other objects which have not been mentioned above will be clearly understood to those of ordinary skill in the art from the following description.

According to some example embodiments of inventive concepts, a semiconductor carrier storage system may comprise a plurality of storage ports each of which is configured to accommodate a semiconductor carrier; a shuttle rail that extends in a horizontal direction on a side of the plurality of storage ports; an internal carrier shuttle configured to move along the shuttle rail and to transfer the semiconductor carrier to each of the plurality of storage ports; and an upper transport configured to receive the semiconductor carrier from an overhead hoist transport (OHT). The internal carrier shuttle may include: a shuttle body coupled to the shuttle rail; a transfer wheel that connects the shuttle body to the shuttle rail; a gripper configured to hold the semiconductor carrier; and a hoist configured to vertically extend between the shuttle body and the gripper and to drive the gripper to vertically move.

According to some example embodiments of inventive concepts, a semiconductor fabrication system may comprise: a semiconductor process chamber; a transfer system configured to transfer a semiconductor carrier to the semiconductor process chamber; and a semiconductor carrier storage system configured to store the semiconductor carrier transferred from the transfer system. The semiconductor carrier storage system may include: a plurality of storage ports each of which is configured to accommodate the semiconductor carrier; a shuttle rail on a side of the plurality of storage ports; an internal carrier shuttle configured to move along the shuttle rail and to transfer the semiconductor carrier to the storage port; an upper transfer port that is spaced apart in a horizontal direction from the plurality of storage ports and is configured to receive the semiconductor carrier from the transfer system; and a lower transfer port that is located below the plurality of storage ports and is configured to receive the semiconductor carrier from the transfer system.

According to some example embodiments of inventive concepts, a semiconductor fabrication method may comprise: having a transfer system pick up a semiconductor carrier from a semiconductor process chamber; having the transfer system load the semiconductor carrier on a semiconductor carrier storage system; having an internal carrier shuttle of the semiconductor carrier storage system pick up the semiconductor carrier; and having the internal carrier shuttle move along a shuttle rail and place the semiconductor carrier on a storage port of the semiconductor carrier storage system. The step of having the internal carrier shuttle pick up the semiconductor carrier may include: having a hoist of the internal carrier shuttle cause a griper to descend from a shuttle body; having the descended gripper hold the semiconductor carrier; and ascending the gripper that holds the semiconductor carrier.

Details of various example embodiments are included in the description and drawings.

DETAILED DESCRIPTION OF EXAMPLE EMBODIMENTS

Figure 1:
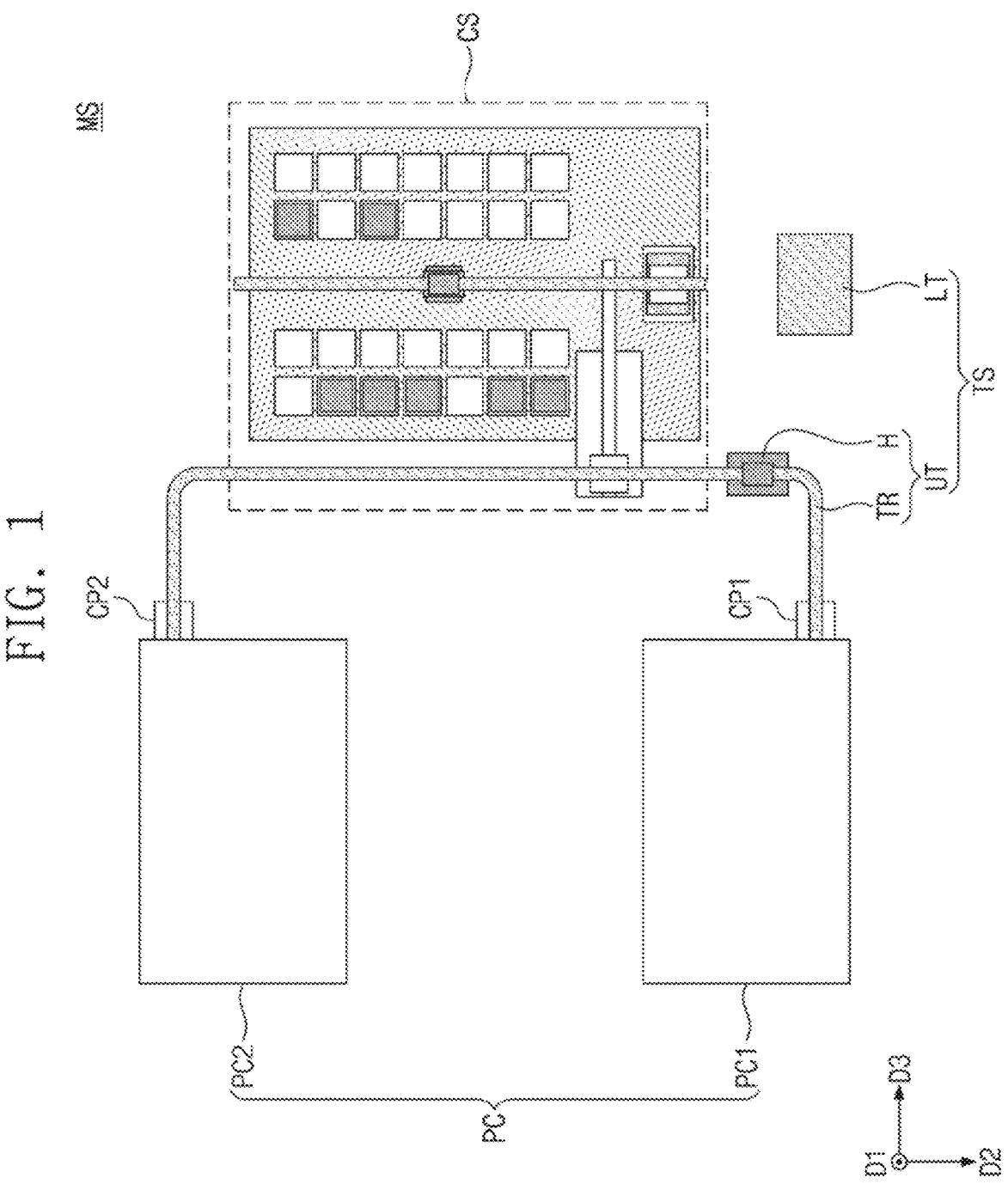
FIG. 1 illustrates a plan view showing a semiconductor fabrication system according to some example embodiments of inventive concepts.

The following will now describe some example embodiments of inventive concepts with reference to the accompanying drawings. Like reference numerals may indicate like components throughout the description.

FIG. 1 illustrates a plan view showing a semiconductor fabrication system according to some example embodiments of inventive concepts.

In this description, symbol D1 may indicate a first direction, symbol D2 may indicate a second direction that intersects the first direction D1, and symbol D3 may indicate a third direction that intersects each of the first direction D1 and the second direction D2. The first direction D1 may be called a vertical direction. In addition, each of the second and third directions D2 and D3 may be called a horizontal direction. In some example embodiments, D2 and D3 may be horizontal with respect to a floor, e.g., a floor of a fabrication facility.

Referring to FIG. 1, a semiconductor fabrication system MS may be provided. The semiconductor fabrication system MS may be or may include a system that performs one or more processes for fabricating a semiconductor device. The semiconductor fabrication system MS may include a semiconductor process chamber PC, a transfer system TS, and a semiconductor carrier storage system CS.

The semiconductor process chamber PC may be a chamber that performs a process on a semiconductor substrate. A semiconductor substrate may include a silicon (Si) wafer, but inventive concepts are not limited thereto, and in some example embodiments, the substrate may be or may include, for example, a glass substrate and/or a liquid-crystal display (LCD) substrate and/or a light-emitting diode (LED) substrate and/or a solar cell substrate. The semiconductor process chamber PC may perform one or more of various processes on a semiconductor substrate. For example, the semiconductor process chamber PC may be configured to allow a semiconductor substrate to undergo one or more of a deposition process, an etching process, a photolithography process, a cleaning process, an implantation process, an annealing process, and a polishing process. The semiconductor process chamber PC may be provided in plural. For example, as shown in FIG. 1, the semiconductor process chamber PC may include a first process chamber PC1 and a second process chamber PC2. A process performed in the first process chamber PC1 may be different from a process performed in the second process chamber PC2. The second process chamber PC2 may receive a semiconductor substrate that has been processed in the first process chamber PC1. Although two process chambers are illustrated, example embodiments are not limited thereto.

The transfer system TS may transfer a semiconductor substrate between a plurality of semiconductor process chambers PC. A semiconductor substrate may be transferred while inserted into a semiconductor carrier (see SC of FIG. 2). For example, the transfer system TS may transfer a semiconductor carrier. The transfer system TS may include an upper transport UT and a lower transport LT.

The upper transport UT may be installed on a ceiling, e.g., a ceiling of at least one level of a fabrication facility. For example, a portion of the upper transport UT may be combined with the ceiling of a space in which the semiconductor fabrication system MS is positioned. The upper transport UT may include a transport rail TR and an overhead hoist transport H. The transport rail TR may connect a plurality of semiconductor process chambers PC to each other. For example, as shown in FIG. 1, the transport rail TR may connect the first process chamber PC1 to or with the second process chamber PC2. One end of the transport rail TR may be connected to a first port CP1 of the first process chamber PC1, and another end of the transport rail TR may be connected to a second port CP2 of the second process chamber PC2. The overhead hoist transport H may be coupled to the transport rail TR. The overhead hoist transport H may move along the transport rail TR. The overhead hoist transport H may pick up a semiconductor carrier disposed on the first port CP1. A semiconductor carrier may mean or correspond to one or more of a front opening unified pod (FOUP) and a cassette, but inventive concepts are not limited thereto. Either or both of the FOUPs and the cassettes may be capable of carrying a plurality of semiconductor substrates, such as twenty-five semiconductor substrates; however, example embodiments are not limited thereto. The overhead hoist transport H may move along the transport rail TR, while picking up a semiconductor carrier. The overhead hoist transport H may load a semiconductor carrier on the semiconductor carrier storage system CS. In addition, the overhead hoist transport H may pick up a semiconductor carrier from the semiconductor carrier storage system CS. The overhead hoist transport H may load the picked-up semiconductor carrier on the second port CP2.

The lower transport LT may be positioned on a floor, e.g., on a floor of a level within fabrication facility. For example, the lower transport LT may be placed on the floor of a space in which the semiconductor fabrication system MS, and may move along the floor. The lower transport LT may include one or more of an automated guided vehicle (AGV) and an autonomous mobile robot (AMR), but inventive concepts are not limited thereto. For convenience, the lower transport LT is illustrated hereinafter as an automated guided vehicle (AGV).

The semiconductor carrier storage system CS may store a semiconductor carrier. For example, a semiconductor carrier transferred from the transfer system TS may be stored for a certain dynamically determined and/or predetermined time in the semiconductor carrier storage system CS. The semiconductor carrier storage system CS may be connected to the transfer system TS. The semiconductor carrier storage system CS will be further discussed in detail below with reference to FIGS. 2 to 5.

Figure 2:
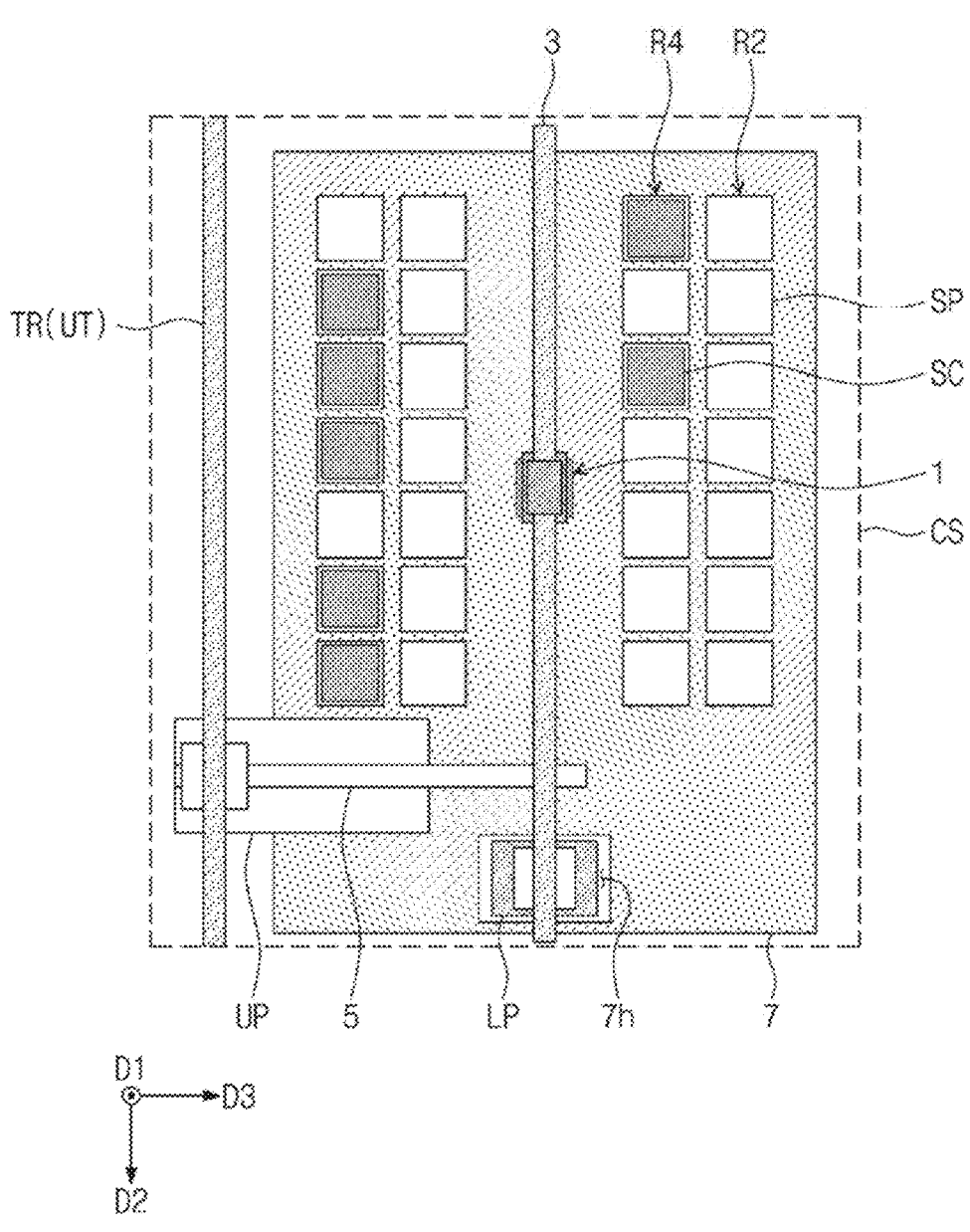
FIG. 2 illustrates a plan view showing a semiconductor carrier storage system according to some example embodiments of inventive concepts.
Figure 3:
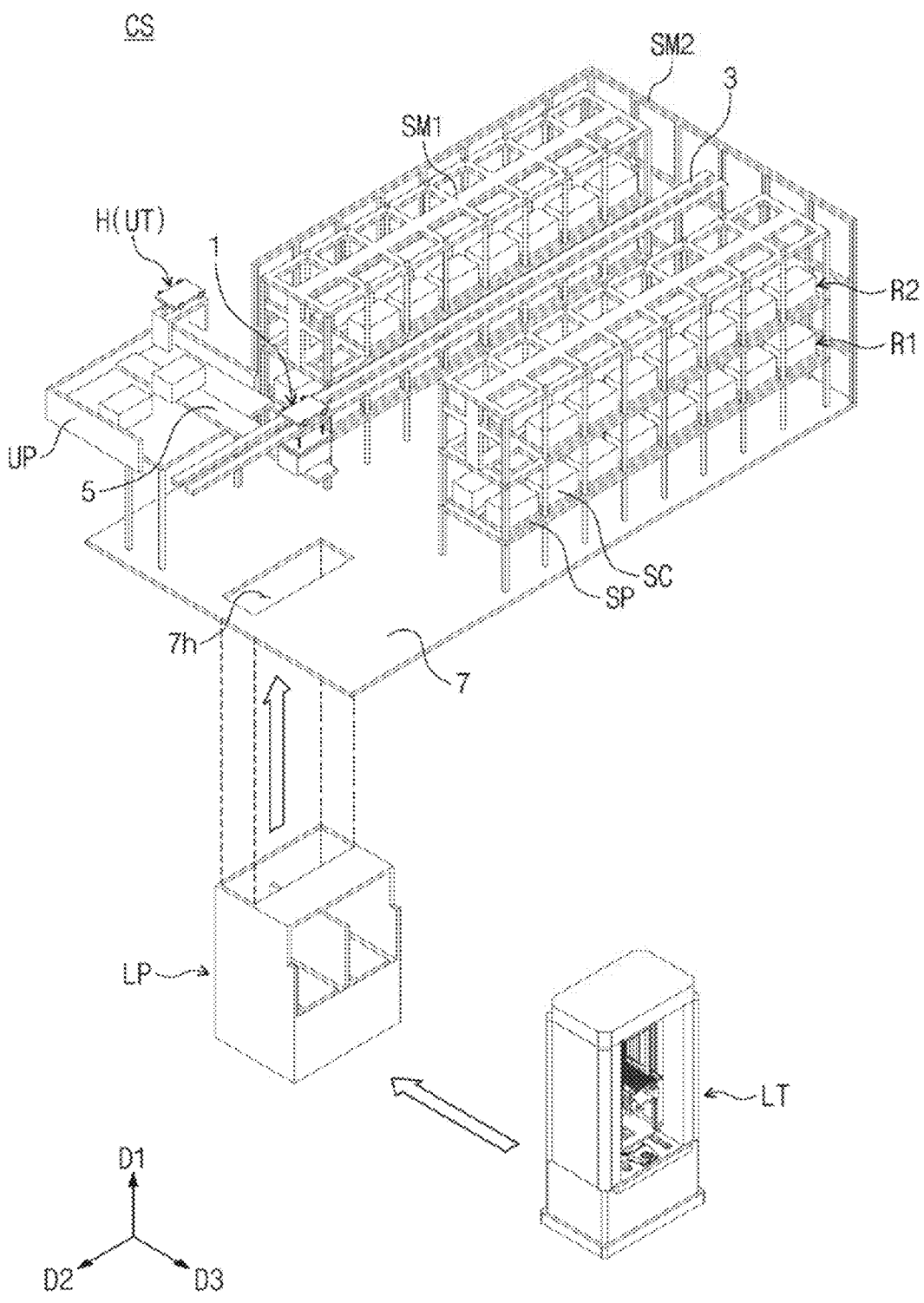
FIG. 3 illustrates a perspective view showing a semiconductor carrier storage system according to some example embodiments of inventive concepts.

FIG. 2 illustrates a plan view showing a semiconductor carrier storage system according to some example embodiments of inventive concepts. FIG. 3 illustrates a perspective view showing a semiconductor carrier storage system according to some example embodiments of inventive concepts.

Referring to FIGS. 2 and 3, the semiconductor carrier storage system CS may include a storage port SP, a shuttle rail 3, an internal carrier shuttle 1, an internal transfer device 5, a lower plate 7, an upper transfer port UP, and a lower transfer port LP.

The storage port SP may accommodate a semiconductor carrier SC. For example, the semiconductor carrier SC may rest on the storage port SP. The storage port SP may include a configuration capable of supporting the semiconductor carrier SC. For example, as shown in FIG. 3, the storage port SP may have a plate shape that supports the semiconductor carrier SC. For another example, the storage port SP may have a bar shape capable of supporting the semiconductor carrier SC. For another example, the storage port SP may be provided in the form of any outer suitable shape. Although not shown, the storage port SP may include a separate structure capable of being coupled to the semiconductor carrier SC. For example, the storage port SP may include one or more of a protrusion structure and a clamp structure, either or both of which can be coupled to one or more of bottom and lateral surfaces of the semiconductor carrier SC. Inventive concepts, however, are not limited thereto, and the storage port SP may include one or more other configurations to support the semiconductor carrier SC. As shown in FIG. 3, the storage port SP may be coupled through a first support member SM1 to a ceiling. The storage port SP may be supported by the ceiling. For example, the storage port SP may be installed on the ceiling and upwardly spaced apart from a floor. Inventive concepts, however, are not limited thereto, and the storage port SP may be supported by the lower plate 7.

The storage port SP may be provided in plural. The plurality of storage ports SP may be arranged in the horizontal direction. For example, a row may be defined by the plurality of storage ports SP that are arranged in the second direction D2. A plurality of rows may be provided which are formed by the plurality of storage ports SP arranged in the second direction D2. For example, there may be a first row R1, a second row R2, a third row (not designated by reference numeral), and a fourth row R4. The second row R2 and the fourth row R4 may be spaced apart from each other in the horizontal direction. The first row R1 and the second row R2 may be spaced apart from each other in the vertical direction. For example, the second row R2 may be positioned on the first row R1. Ones of the plurality of storage ports SP may be disposed vertically spaced apart from each other. Four rows are described in the interest of convenience, but inventive concepts are not limited thereto. Unless otherwise especially stated, a single storage port SP will be discussed for convenience.

The shuttle rail 3 may be positioned on a side of the plurality of storage ports SP. The shuttle rail 3 may extend in the horizontal direction. For example, the shuttle rail 3 may extend in the second direction D2 along the arrangement of the plurality of storage ports SP. The shuttle rail 3 may guide movement of the internal carrier shuttle 1. The shuttle rail 3 may be spaced apart from the transport rail TR. For example, the shuttle rail 3 may not be connected to the transport rail TR. Alternatively or additionally, a shape of the shuttle rail 3 may be different from that of the transport rail TR. For example, the shuttle rail 3 and the transport rail TR may or may not be different kinds of rail.

The internal carrier shuttle 1 may be coupled to the shuttle rail 3. The internal carrier shuttle 1 may move along the shuttle rail 3. The internal carrier shuttle 1 may pick up the semiconductor carrier SC. The internal carrier shuttle 1 may transfer the semiconductor carrier SC that is picked up. For example, the internal carrier shuttle 1 may pick up the semiconductor carrier SC on the upper transfer port UP and/or the lower transfer port LP, and may transfer the picked-up semiconductor carrier SC to the storage port SP. The internal carrier shuttle may be a hoist type. A detailed description thereof will be further discussed below.

The lower plate 7 may be positioned below the storage port SP. For example, the lower plate 7 may be downwardly spaced apart from the storage port SP. When viewed in plan, the lower plate 7 may extend the second direction D2 and the third direction D3 so as to cover the plurality of storage ports SP. A worker, such as an operator and/or a technician and/or a robot, may ascend to the lower plate 7. For example, when the storage port SP needs maintenance or is to have maintenance performed, a worker may ascend to the lower plate 7 and perform a work process. The lower plate 7 may divide the semiconductor carrier storage system CS thereon from another space. As shown in FIG. 3, the lower plate 7 may be coupled through a second support member SM2 to the ceiling. The lower plate 7 may be supported by the ceiling. For example, the lower plate 7 may be installed on the ceiling and upwardly spaced apart from the floor.

The lower plate 7 may provide or may define a carrier movement hole 7h. The carrier movement hole 7h may vertically penetrate the lower plate 7, and may have a shape such as a polygonal shape such as a rectangular shape; however, example embodiments are not limited thereto. The carrier movement hole 7h may be larger than the semiconductor carrier SC. For example, when viewed in plan, an area of the carrier movement hole 7h may be greater than that of the semiconductor carrier SC. Therefore, the semiconductor carrier SC may pass through the carrier movement hole 7h. The carrier movement hole 7h may be positioned on the lower transfer port LP. For example, the carrier movement hole 7h may be positioned upwardly spaced apart from the lower transfer port LP. In this configuration, when viewed in plan, the carrier movement hole 7h may overlap the lower transfer port LP.

The upper transfer port UP may be spaced apart from the storage port SP. For example, the upper transfer port UP may be spaced apart in the horizontal direction from the storage port SP. The upper transfer port UP may receive the semiconductor carrier SC from the overhead hoist transport H. A portion of the upper transfer port UP may be positioned below the transport rail TR. The upper transfer port UP may include a configuration capable of supporting the semiconductor carrier SC loaded from the overhead hoist transport H. For example, as shown in FIG. 3, the upper transfer port UP may have a plate shape that supports the semiconductor carrier SC. For another example, the upper transfer port SP may have a bar shape capable of supporting the semiconductor carrier SC. For another example, the upper transfer port UP may be provided in the form of any other suitable shape. As illustrated in FIG. 3, the upper transfer port UP may be coupled to the lower plate 7. For example, the lower plate 7 may support the upper transfer port UP. Inventive concepts, however, are not limited thereto, and the upper transfer port UP may be coupled to the ceiling.

The lower transfer port LP may be positioned below the storage port SP. For example, the lower transfer port LP may be downwardly spaced apart from the storage port SP. In this configuration, the lower transfer port LP may be positioned lower than the lower plate 7. The lower transfer port LP may be positioned on the floor. The lower transfer port LP may receive the semiconductor carrier SC from the lower transport LT. The lower transfer port LP may be positioned below one side of the shuttle rail 3. The internal carrier shuttle 1, which moves along the shuttle rail 3, may thus be disposed on the lower transfer port LP. The internal carrier shuttle 1 may pick up the semiconductor carrier SC on the lower transfer port LP. The lower transfer port LP may be positioned below the carrier movement hole 7h. For example, the carrier movement hole 7h may be positioned upwardly spaced apart from the lower transfer port LP. Therefore, when the semiconductor carrier SC on the lower transfer port LP is picked up by the internal carrier shuttle 1, the semiconductor carrier SC may pass through the carrier movement hole 7h. The lower transfer port LP may be provided in a form capable of supporting the semiconductor carrier SC. For example, as shown in FIG. 3, the lower transfer port LP may be provided in the form of a support that supports the semiconductor carrier SC. The lower transfer port LP may have a lateral surface that is opened to receive the semiconductor carrier SC from the lower transport LT. The lower transfer port LP may have a top surface at least a portion of which is opened to receive the semiconductor carrier SC from the internal carrier shuttle 1. Inventive concepts, however, are not limited thereto, and the lower transfer port LP may be provided in any other suitable shape.

The internal transfer device 5 may transfer the semiconductor carrier SC in the horizontal direction. One side of the internal transfer device 5 may be connected to the upper transfer port UP. Another side of the internal transfer device 5 may be positioned below the shuttle rail 3. For example, the one side of the internal transfer device 5 may be coupled onto the upper transfer port UP. The internal transfer device 5 may include various configurations capable of transferring the semiconductor carrier SC. For example, as shown in FIG. 3, the internal transfer device 5 may have a rail shape. For another example, the internal transfer device 5 may have a conveyor belt. In this case, the internal transfer device 5 may extend in the horizontal direction. Inventive concepts, however, are not limited thereto.

Figure 4:
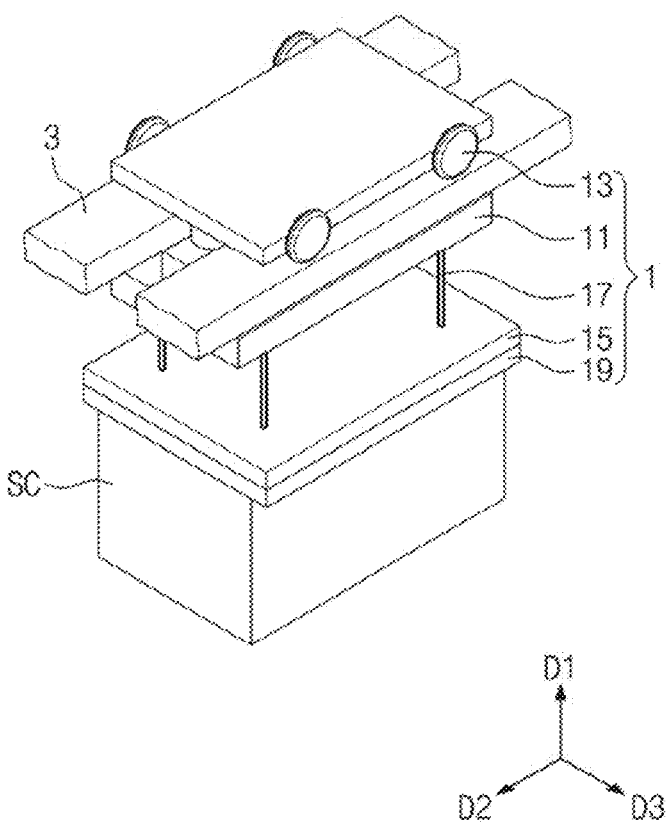
FIG. 4 illustrates a perspective view showing an internal carrier shuttle according to some example embodiments of inventive concepts.
Figure 5:
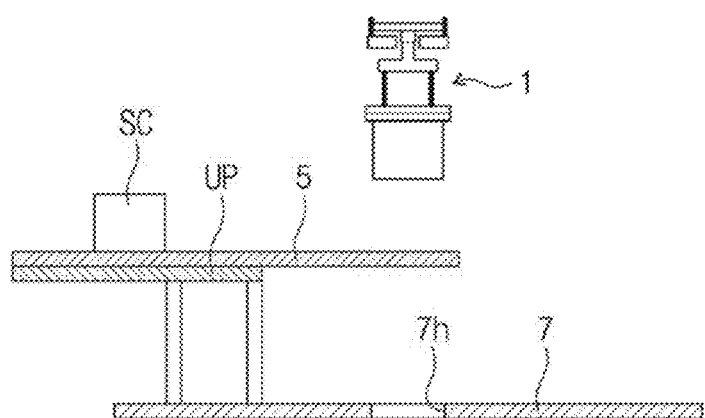
FIG. 5 illustrates a front view showing a semiconductor carrier storage system according to some example embodiments of inventive concepts.
Figure 5:
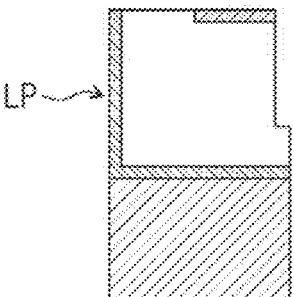

FIG. 4 illustrates a perspective view showing an internal transport shuttle according to some example embodiments of inventive concepts. FIG. 5 illustrates a front view showing a semiconductor carrier storage system according to some example embodiments of inventive concepts.

Referring to FIG. 4, the internal carrier shuttle 1 may include a shuttle body 11, a transfer wheel 13, a horizontal slider 15, a hoist 17, and a gripper 19.

The shuttle body 11 may be couple to the shuttle rail 3. The shuttle body 11 may support the gripper 19. The gripper 19 may be vertically movable relative to the shuttle body 11.

The transfer wheel 13 may be positioned on the shuttle rail 3. The transfer wheel 13 may connect the shuttle body 11 to the shuttle rail 3. For example, the shuttle body 11 may couple through the transfer wheel 13 to the shuttle rail 3. The transfer wheel 13 may support the shuttle body 11. For example, a load on the shuttle body 11 may be transmitted through the transfer wheel 13 to the shuttle rail 3. The shuttle body 11 may be movable in such a way that the transfer wheel 13 moves on the shuttle rail 3. Thus, when the shuttle 3 extends in a curved fashion, the shuttle body 11 may also move in a curved fashion along the shuttle rail 3. The transfer wheel 13 may be provided in plural. For example, as shown in FIG. 4, four transfer wheels 13 may be provided, but inventive concepts are not limited thereto, and the number of wheels may be greater than or less than four. A single transfer wheel 13 will be discussed below in the interest of convenience.

The hoist 17 may vertically extend between the shuttle body 11 and the gripper 19. The hoist 17 may have one or more of a flexible string shape and a flexible rope shape. The gripper 19 may be connected through the hoist 17 to the shuttle body 11. For example, a load on the gripper 19 may be transmitted through the hoist 17 to the shuttle body 11. When the hoist 17 ascends or descends, the gripper 19 may move upwards or downwards. The shuttle body 11 may be provided therein with a winder that wraps the hoist 17. In addition, the shuttle body 11 may be provided therein with an actuator, such as a motor, which provides the hoist 17 with power. The hoist 17 may be provided in plural. A single hoist 17 will be discussed below in the interest of convenience.

The horizontal slider 15 may drive the gripper 19 to move in the horizontal direction. The horizontal slider 15 may stretch or contract in the horizontal direction. The horizontal slider 15 may be positioned below the hoist 17. For example, the horizontal slider 15 may be placed between the hoist 17 and the gripper 19. The horizontal slider 15 will be further discussed in detail below.

The gripper 19 may be coupled below the hoist 17. The gripper 19 may hold the semiconductor carrier SC. For example, the semiconductor carrier SC may be selectively coupled below the gripper 19. The gripper 19 may include various configurations for holding the semiconductor carrier SC. For example, the gripper 19 may include a clamp structure (not shown) by which the semiconductor carrier SC is held. Alternatively or additionally, the gripper 19 may use an electromagnetic force to hold the semiconductor carrier SC. Alternatively or additionally, the gripper 19 may use any other suitable method to hold the semiconductor carrier SC. For example, the gripper 19 may include a vacuum and/or other suction mechanism; however, example embodiments are not limited thereto. The gripper 19, which holds the semiconductor carrier SC, may move vertically. The gripper 19 may ascend or descend, which holds the semiconductor carrier SC through the hoist 17. For example, as shown in FIG. 5, the gripper 19 may descend to hold the semiconductor carrier SC on the internal transfer device 5. Alternatively or additionally, the gripper 19 may descend to hold the semiconductor carrier SC on the lower transfer port LP. The gripper 19 will be further discussed in detail below.

Figure 6:
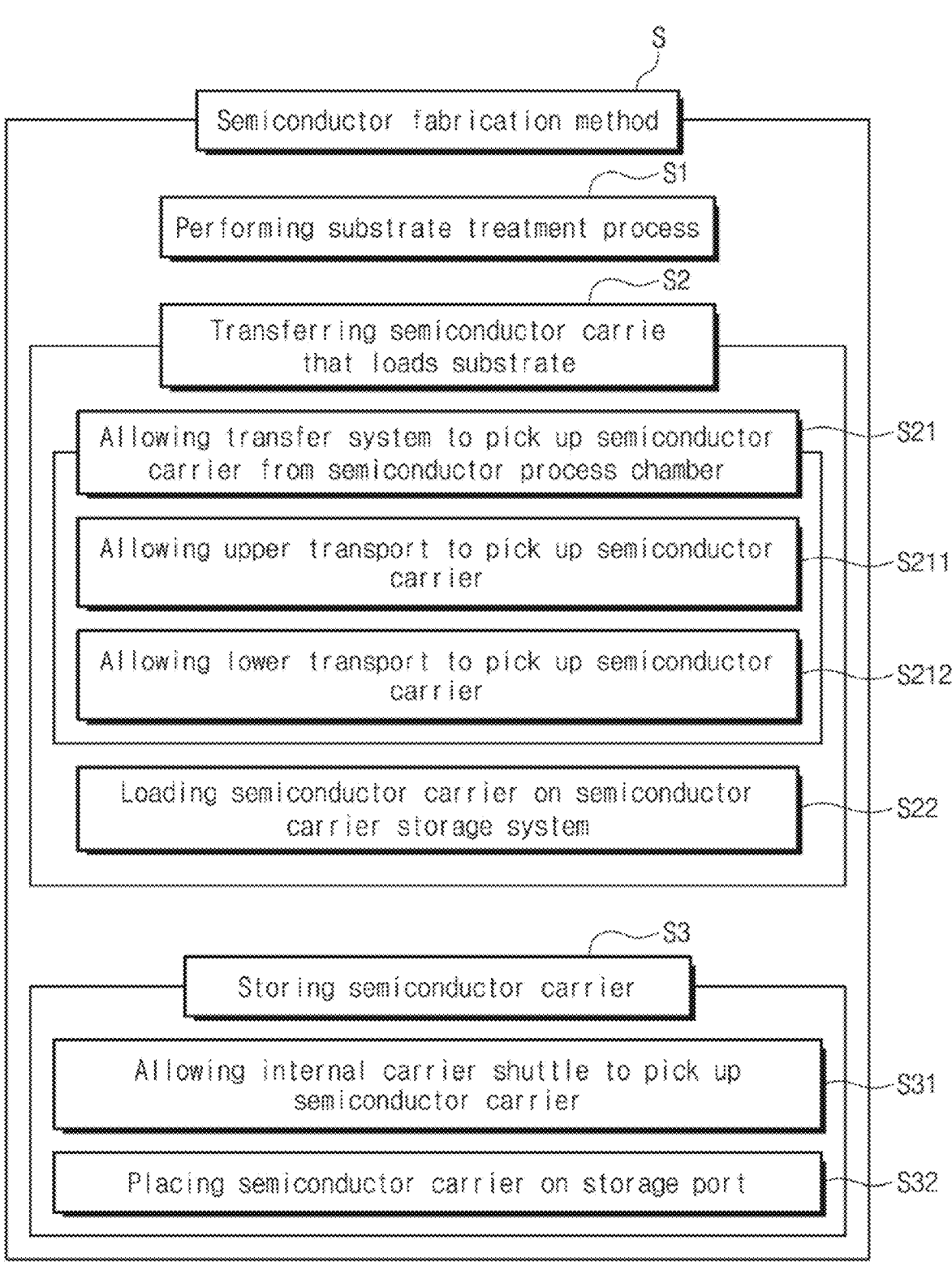
FIG. 6 illustrates a flow chart showing a semiconductor fabrication method according to some example embodiments of inventive concepts.

FIG. 6 illustrates a flow chart showing a semiconductor fabrication method according to various example embodiments of inventive concepts.

Referring to FIG. 6, a semiconductor fabrication method S may be provided. The semiconductor fabrication method S may be or may include a method in which the semiconductor fabrication system MS discussed with reference to FIGS. 1 to 5 is used to for semiconductor fabrication. The semiconductor fabrication method S may include a step S1 of performing a substrate treatment process, a step S2 of transferring a semiconductor carrier that loads a substrate, and a step S3 of storing the semiconductor carrier.

The transfer step S2 may include a step S21 of allowing a transfer system to pick up the semiconductor carrier from a semiconductor process chamber, and a step S22 of loading the semiconductor carrier on a semiconductor carrier storage system.

The pick-up step S21 may include a step S211 of allowing an upper transport to pick up the semiconductor carrier, and a step S212 of allowing a lower transport to pick up the semiconductor carrier.

The storage step S3 may include a step S31 of allowing an internal carrier shuttle to pick up the semiconductor carrier, and a step S31 of placing the semiconductor carrier on a storage port.

With reference to FIGS. 7 to 18, the following will explain each step of the semiconductor fabrication method S discussed in FIG. 6.

FIGS. 7 to 16 illustrate diagrams showing a semiconductor fabrication method according to the flow chart of FIG. 6.

Figure 7:
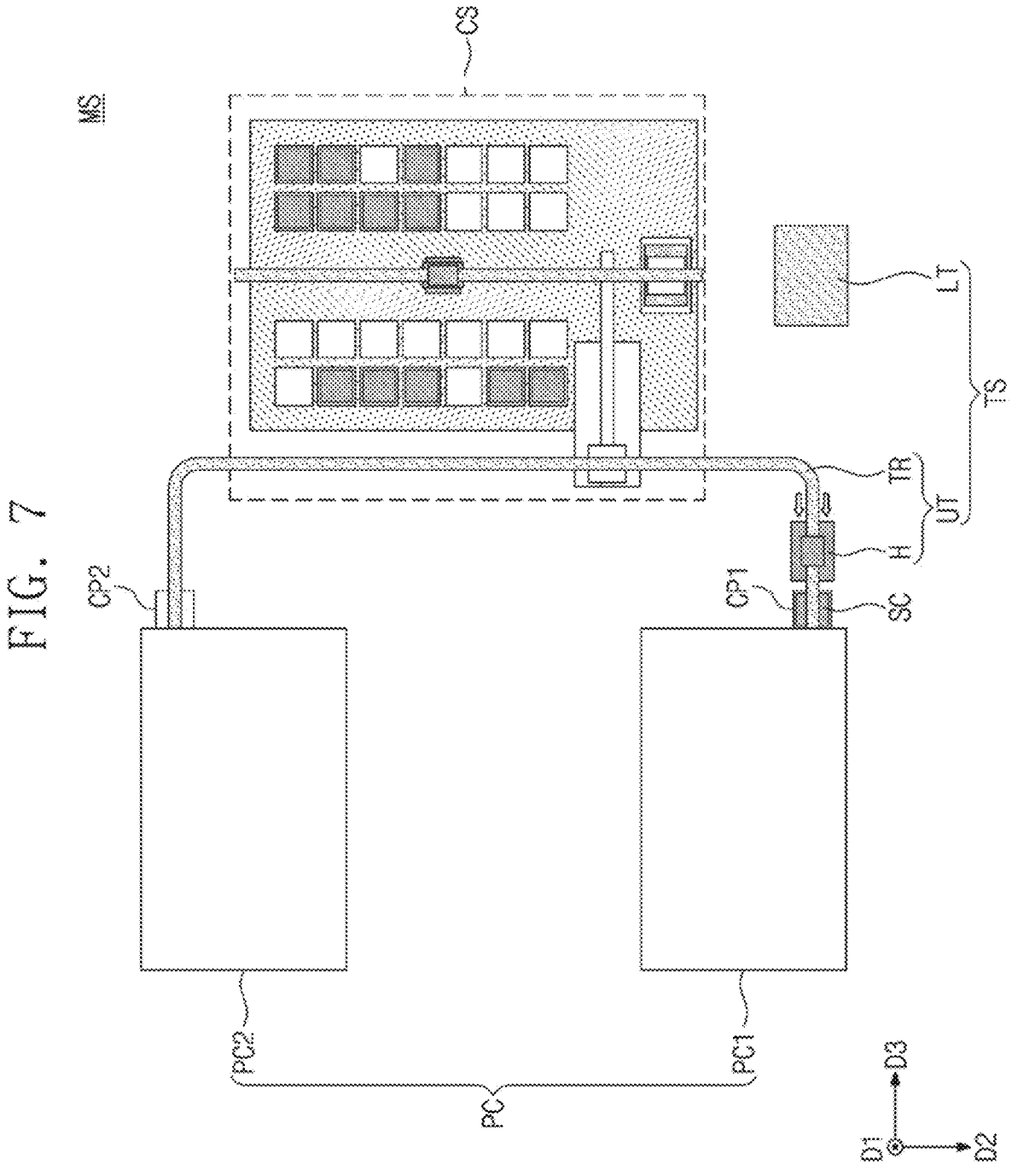
FIGS. 7 to 18 illustrate diagrams showing a semiconductor fabrication method according to the flow chart of FIG. 6.

Referring to FIGS. 6 and 7, the substrate treatment step S1 may include allowing the semiconductor process chamber PC to perform a treatment process on a semiconductor substrate. Various processes may be executed in accordance with a type of the semiconductor process chamber PC. For example, in the first process chamber PC1, the semiconductor substrate may undergo one or more of a deposition process, an etching process, a photolithography process, a cleaning process, an implantation process, an annealing process, and a polishing process. The semiconductor substrate, which has been processed in the first process chamber PC1, may be inserted into the semiconductor carrier SC on the first port CP1.

The pick-up step S211 may include allowing the overhead hoist transport H to pick up the semiconductor carrier SC on the first port CP1. The overhead hoist transport H, which picks up the semiconductor carrier SC, may move along the transport rail TR.

Figure 8:
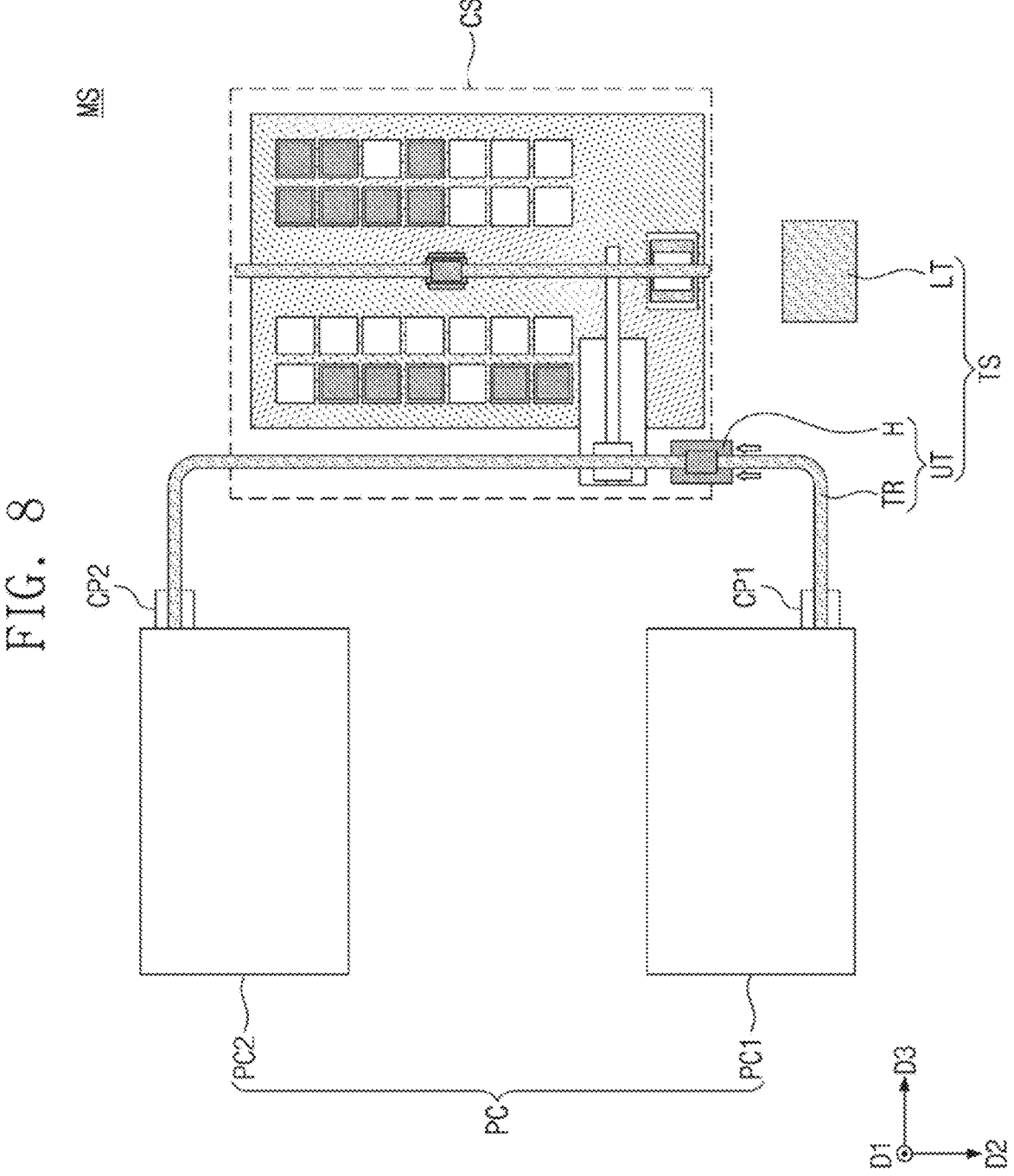
Figure 9:
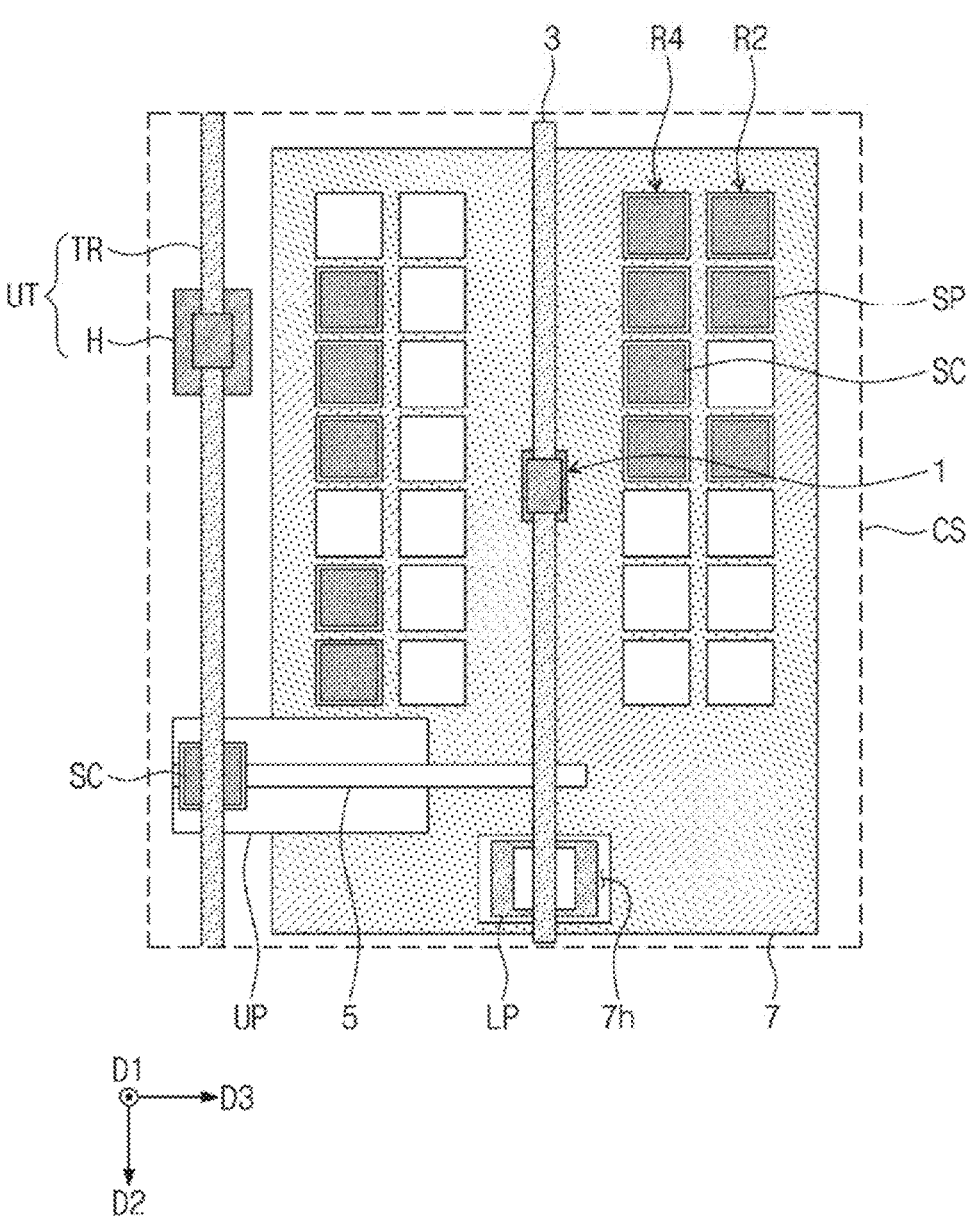

Referring to FIGS. 6, 8, and 9, the loading step S22 may include allowing the overhead hoist transport H to move along the transport rail TR and to place the semiconductor carrier SC on the semiconductor carrier storage system CS. For example, the overhead hoist transport H, which picks up the semiconductor carrier SC, may load the semiconductor carrier SC to the upper transfer port UP.

Figure 10:
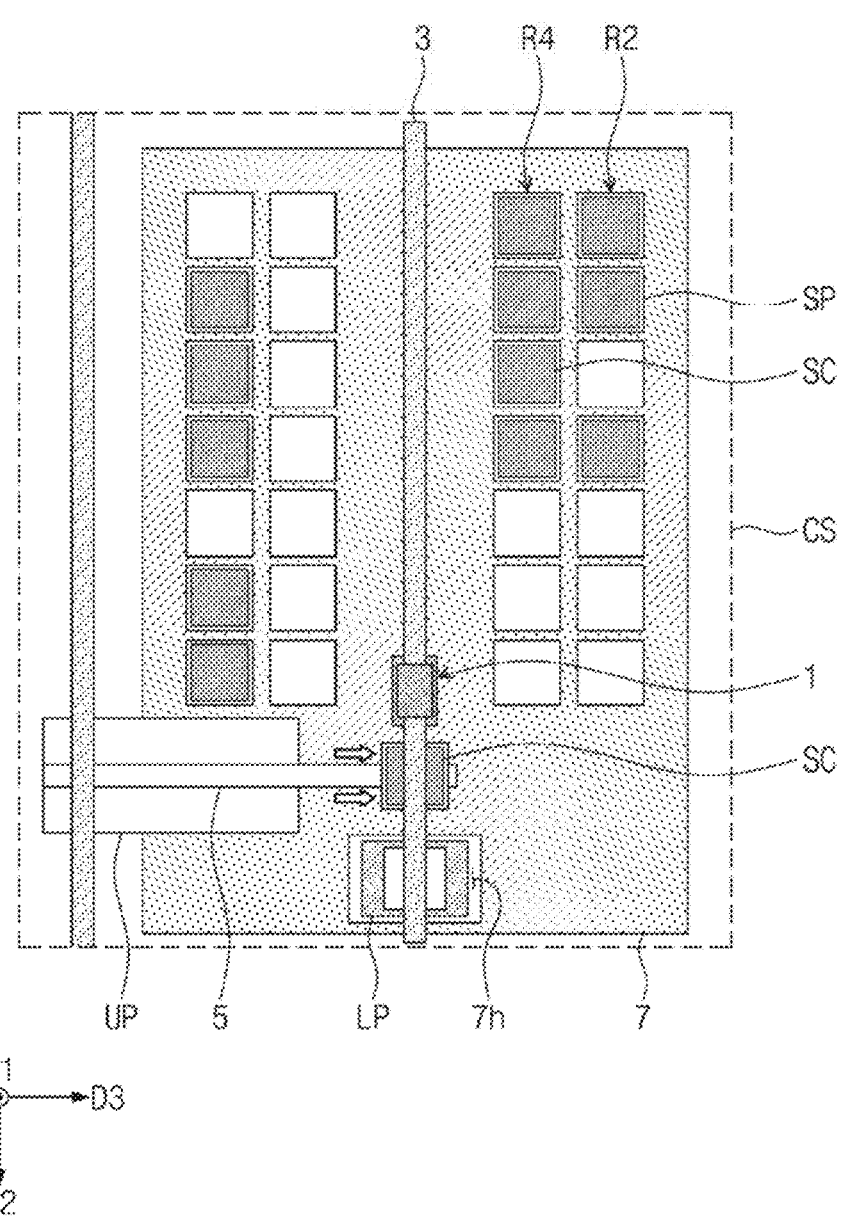
Figure 11:
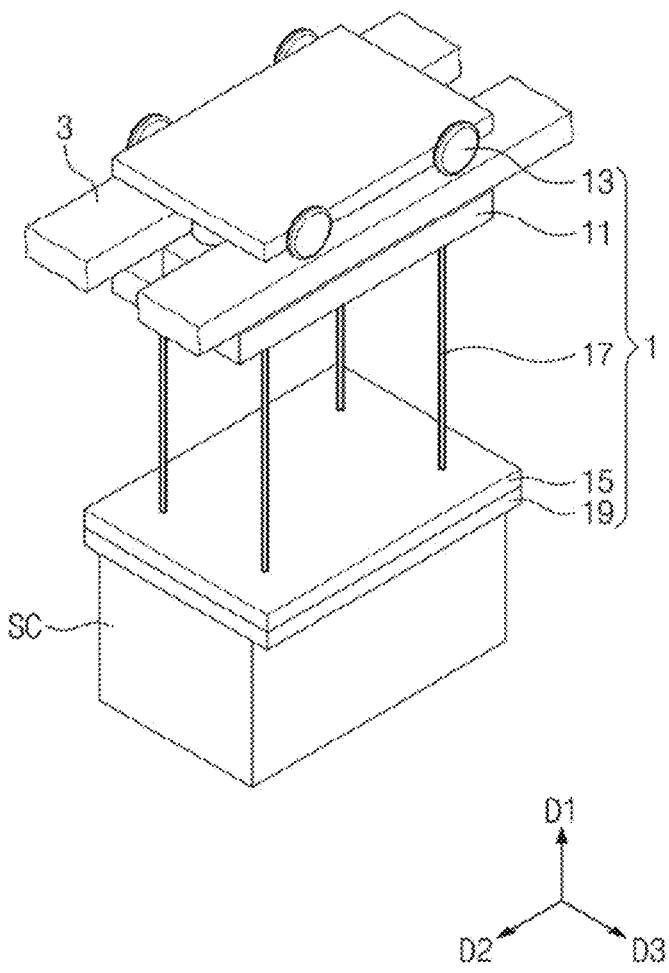
Figure 12:
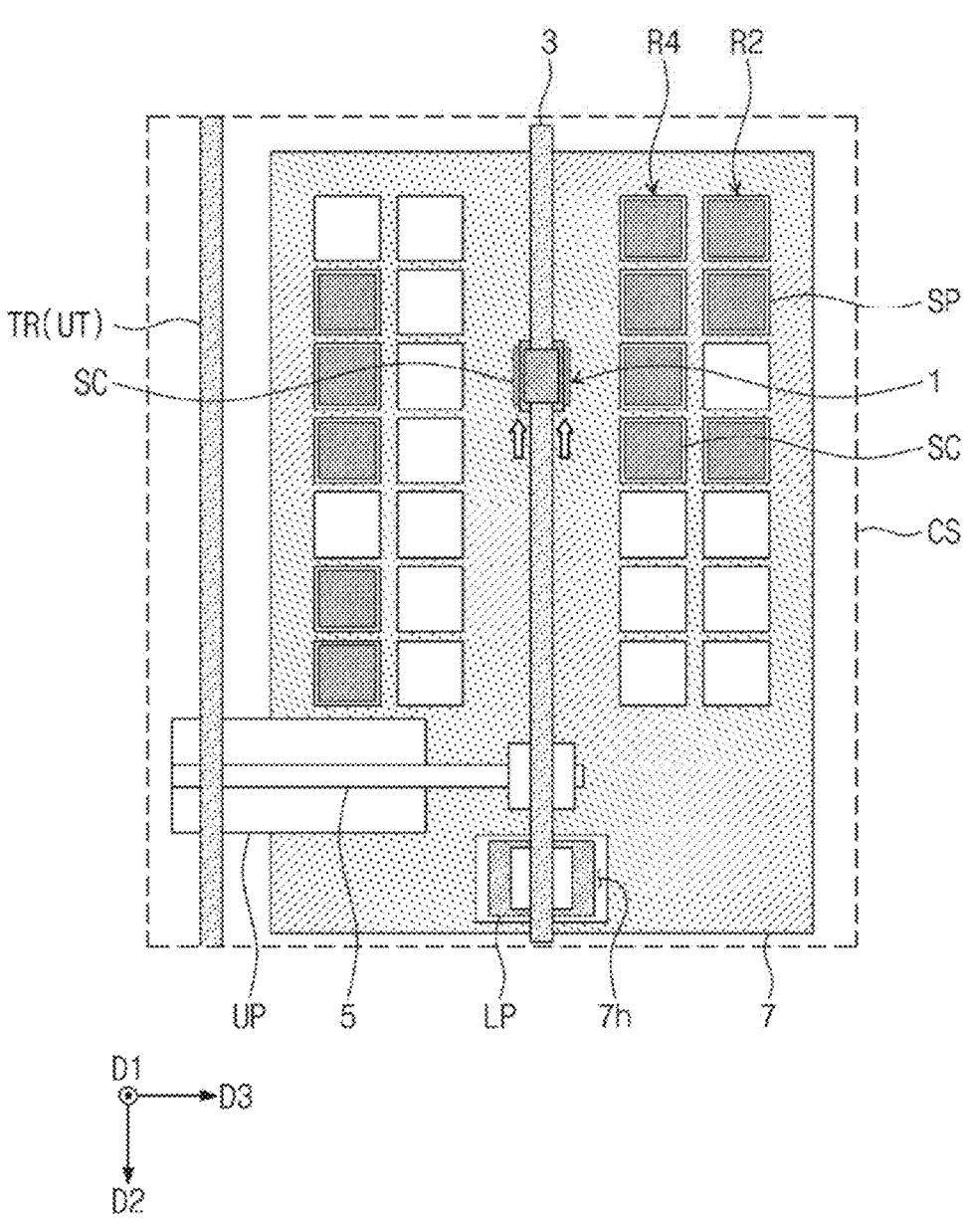

Referring to FIGS. 6, 10, and 11, the pick-up step S31 may include placing the semiconductor carrier SC on a location below the shuttle rail 3. This procedure may be performed by the internal transfer device 5. For example, after the overhead hoist transport H places the semiconductor carrier SC on the upper transfer port UP, the internal transfer device 5 may drive the semiconductor carrier SC to move in the horizontal direction, with the result the semiconductor carrier SC may be placed below the shuttle rail 3. The internal carrier shuttle 1 may pick up the semiconductor carrier SC disposed below the shuttle rail 3. For example, the hoist 17 may cause the gripper 19 to descend. The gripper 19 may depart from the shuttle body 11. The gripper 19 may hold the semiconductor carrier SC. Afterwards, the hoist 17 may raise the gripper 19 that holds the semiconductor carrier SC.

Referring to FIGS. 6, 12, 13, 14, and 15, the placement step S32 may include allowing the internal carrier shuttle 1 that picks up the semiconductor carrier SC to move along the shuttle rail 3. The internal carrier shuttle 1 may move to a location in the vicinity of the storage port SP on which the semiconductor carrier SC held thereby is intended to be placed.

Figure 13:
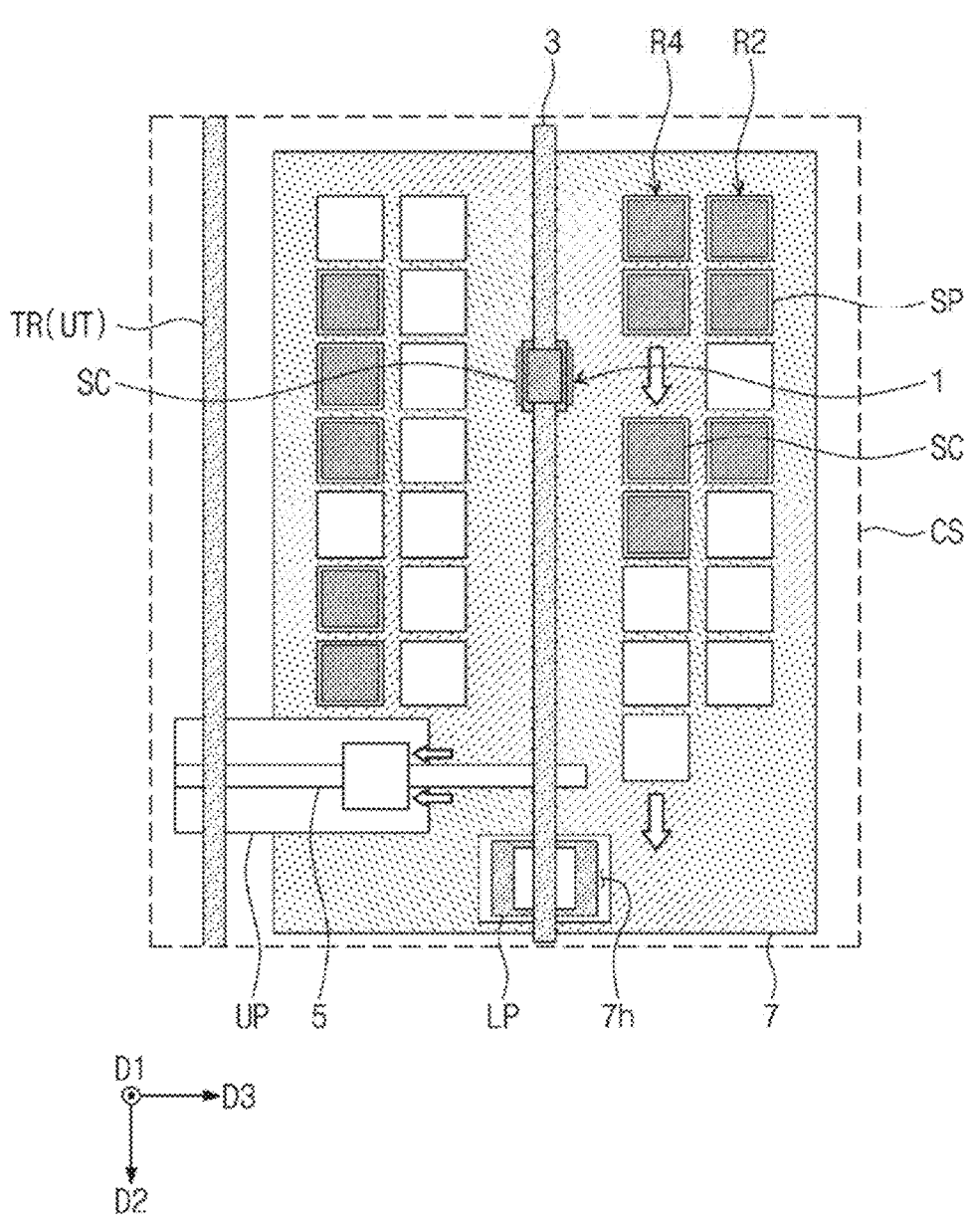
Figure 14:
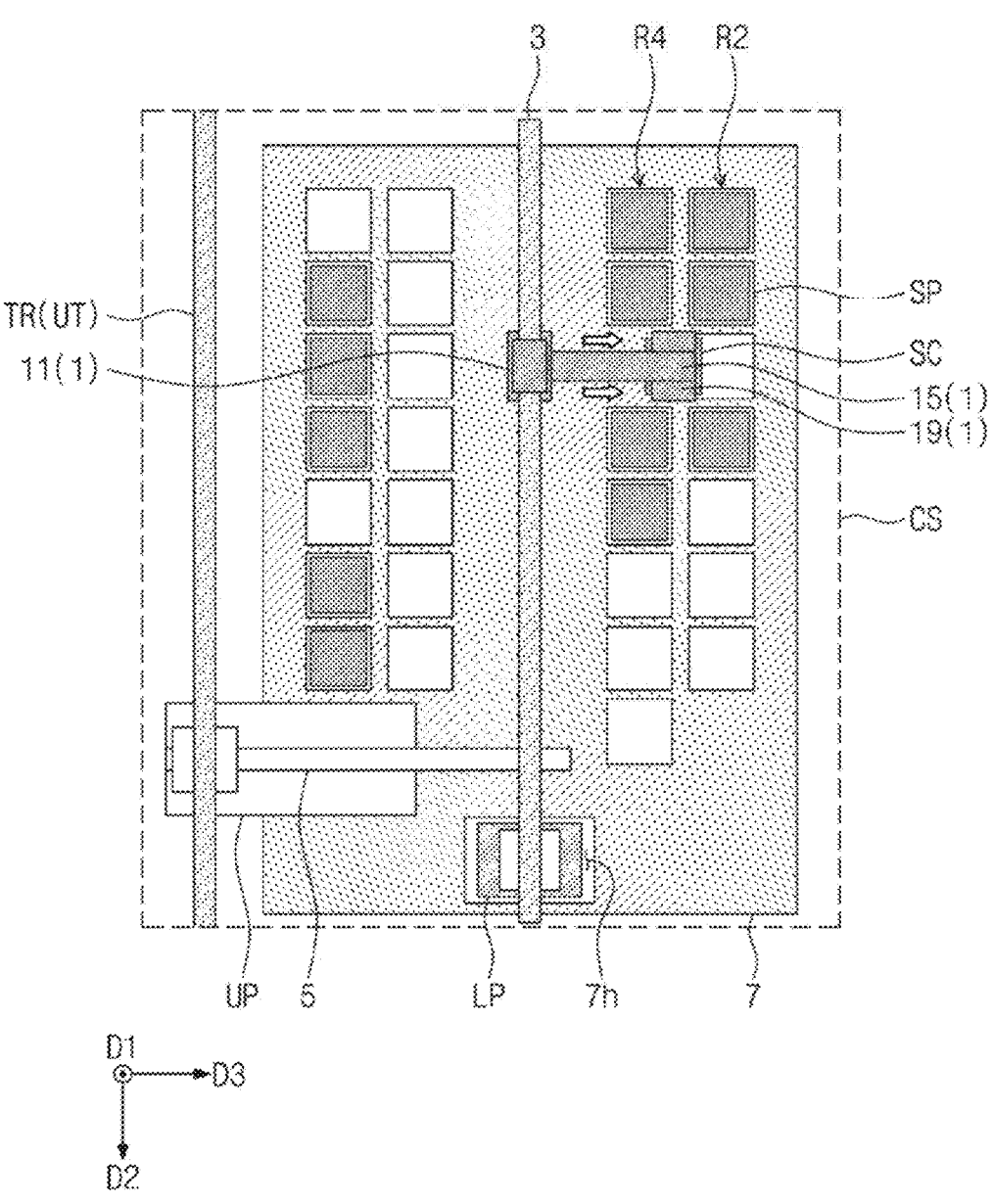

In this procedure, a portion of the storage port SP may move. For example, as shown in FIG. 13, when the semiconductor carrier SC is intended to be placed on an empty storage port SP in the second row R2, a semiconductor carrier disposed on the fourth row R4 may become interruption. In this case, it may be possible to move a portion of the storage port SP in the fourth row R4. For this procedure, a storage transfer device (not shown) may be further provided. The storage transfer device may be positioned below the storage port SP. The storage transfer device may drive the storage port SP in the second row R2 and/or the fourth row R4 to move in the horizontal direction. Therefore, the semiconductor carrier SC on the second row R2 and/or the fourth row R4 may move in the horizontal direction. For example, as shown in FIG. 13, a portion of the semiconductor carrier SC on the fourth row R4 may move in the second direction D2. Therefore, the storage port SP in the second row R2 may be accessible.

The internal carrier shuttle 1 may place the semiconductor carrier SC on the storage port SP. In this stage, the horizontal slider 15 may stretch in the horizontal direction. The horizontal slider 15 may drive the gripper 19 that holds the semiconductor carrier SC to move in the horizontal direction. The semiconductor carrier SC held by the gripper 19 may be placed on a target storage port SP. Thereafter, the gripper 19 may descend to place the semiconductor carrier SC on the storage port SP.

Figure 16:
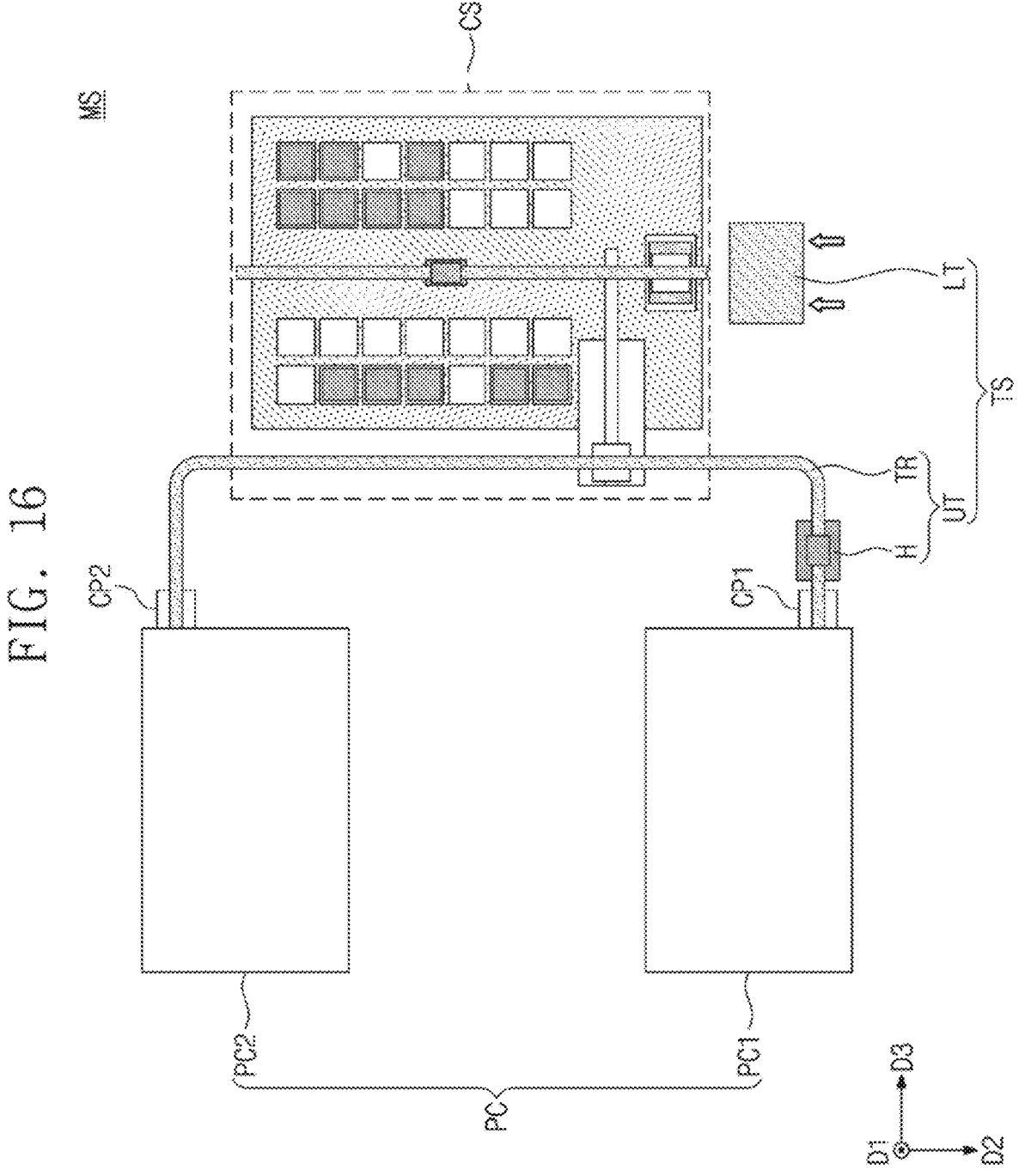

Referring to FIGS. 6 and 16, the pick-up step S212 may include allowing the lower transport LT to pick up the semiconductor carrier SC from the first port CP1. As shown in FIG. 16, the lower transport LT that picks up the semiconductor carrier SC may move to the semiconductor carrier storage system CS.

Figure 15:
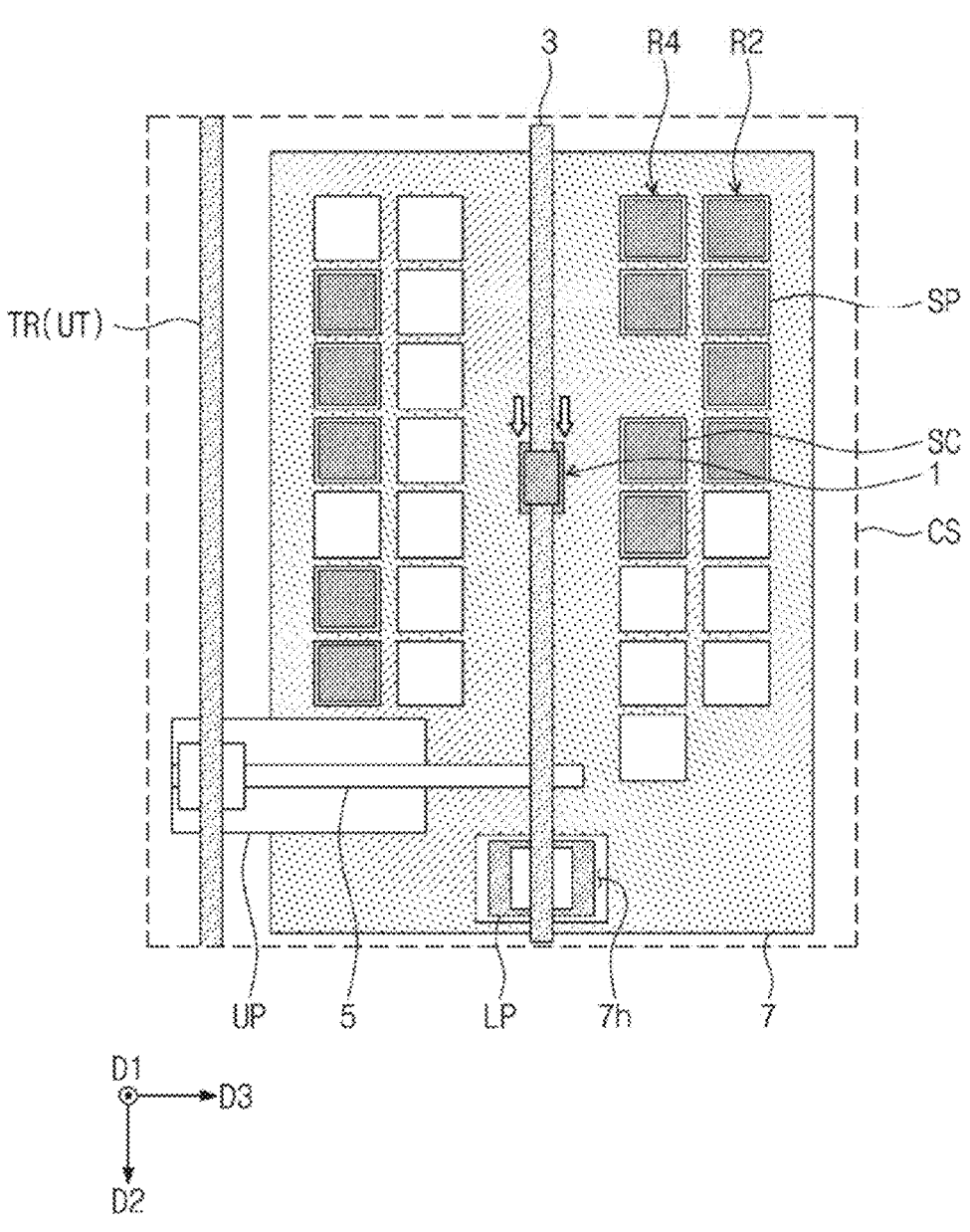
Figure 17:
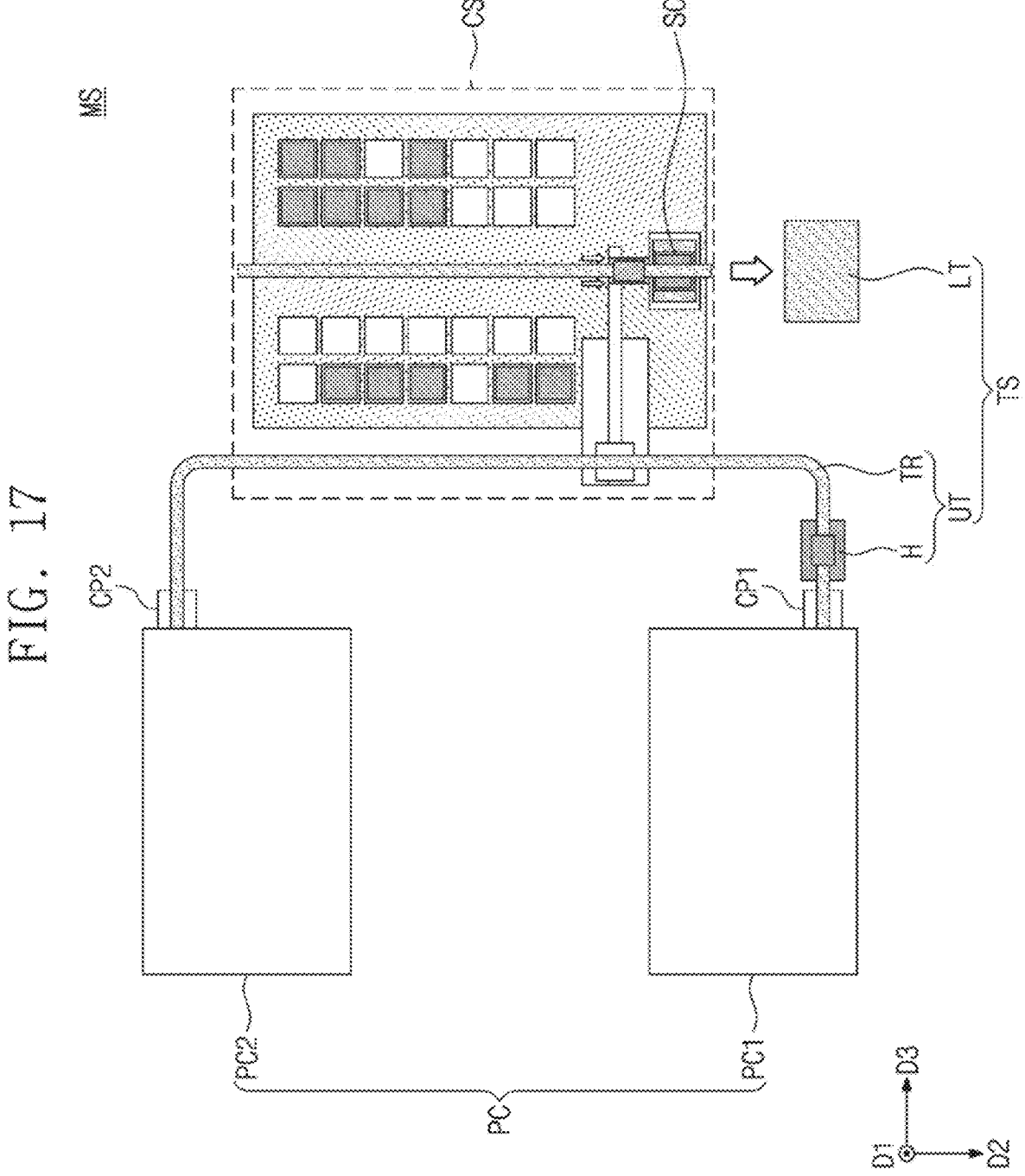

Referring to FIGS. 6 and 17, the loading step S22 may include allowing the lower transport LT that picks up the semiconductor carrier SC to load the semiconductor carrier SC to the lower transfer port (see LP of FIG. 15).

Figure 18:
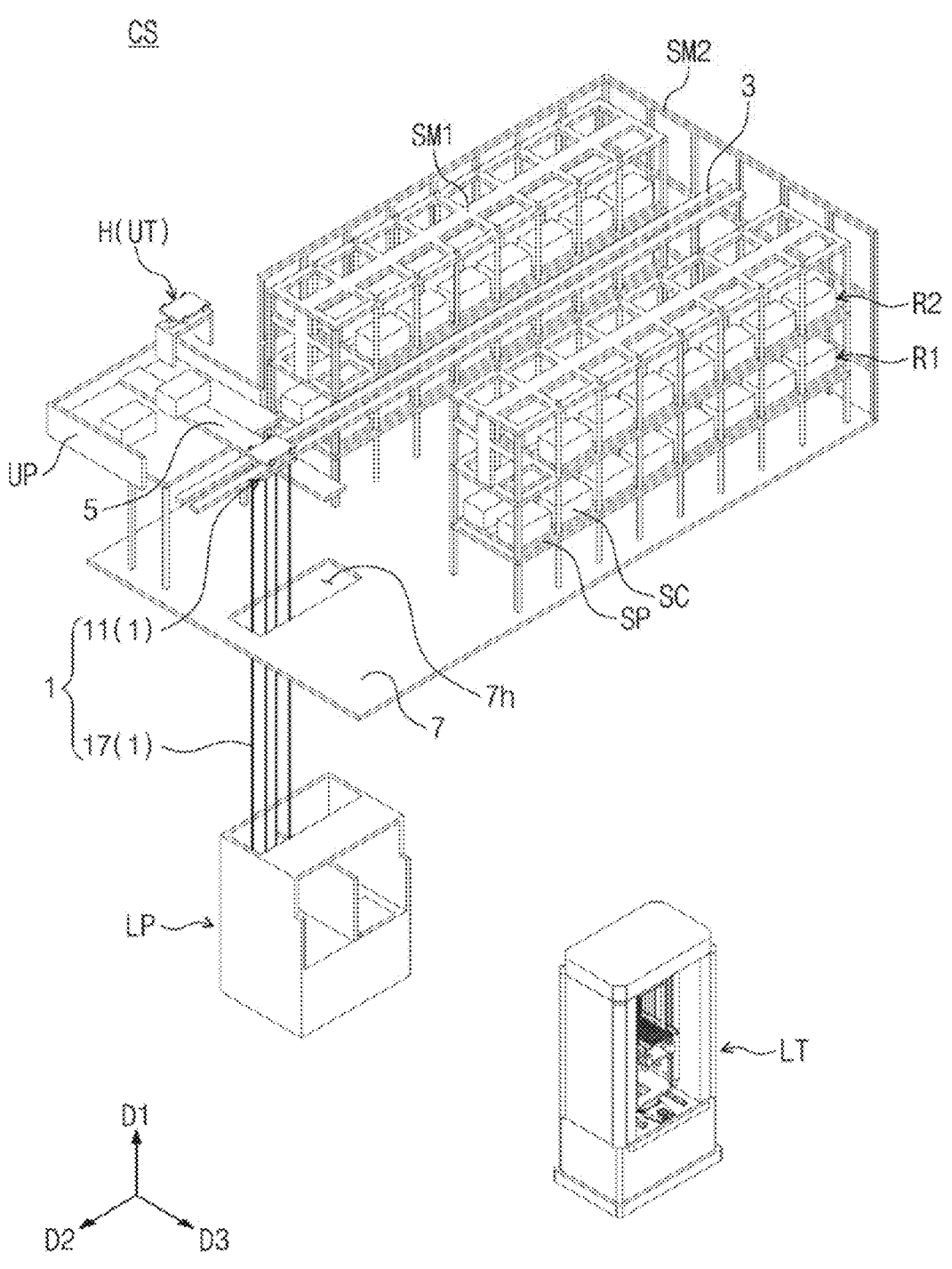

Referring to FIGS. 6 and 18, the pick-up step S31 may include allowing the hoist 17 to cause the gripper (see 19 of FIG. 11) to descend and hold the semiconductor carrier SC on the lower transfer port LP. In this step, the hoist 17 and the gripper 19 may pass through the carrier movement hole 7h. After the gripper 19 holds the semiconductor carrier SC on the lower transfer port LP, the gripper 19 may move upwardly. In this procedure, the semiconductor carrier SC may pass through the carrier movement hole 7h.

According to a semiconductor carrier storage system, a semiconductor fabrication system including the same, and a semiconductor fabrication method using the same in accordance with some example embodiments of inventive concepts, a semiconductor carrier may be stored by using a shuttle rail that is separated from a transport rail that is used by an overhead hoist transport. Therefore, a semiconductor carrier storage system may be installed on an intended location, irrespective of or independent of the overhead hoist transport and the transport rail that are previously equipped. Accordingly, it may be possible to utilize an idle space or otherwise unused space in semiconductor fabrication line. Alternatively or additionally, because an internal carrier shuttle and a shuttle rain are used which are separated from the overhead hoist transport and the transport rail that are previously equipped, cost may be reduced. Alternatively or additionally, the separate internal carrier shuttle may be used to pick up the semiconductor carrier, and then the semiconductor carrier may be placed on a storage port, which may result in no influence on the movement time of the overhead hoist transport. Hence, a greater number of the semiconductor carrier may be promptly transferred and stored. Alternatively or additionally, an overall amount of idle time or queueing time may be decreased, which may improve the fabrication process. For example, defects such as native oxide defects may be reduced in propensity from occurrence.

According to a semiconductor carrier storage system, a semiconductor fabrication system including the same, and a semiconductor fabrication method using the same in accordance with some example embodiments of inventive concepts, a transfer wheel may be used to allow the internal carrier shuttle to move on the shuttle rail. Therefore, even though the shuttle rail is curved, the internal carrier shuttle may move along the curved shuttle rail.

According to a semiconductor carrier storage system, a semiconductor fabrication system including the same, and a semiconductor fabrication method using the same in accordance with some example embodiments of inventive concepts, the internal carrier shuttle may use a hoist to pick up the semiconductor carrier. Thus, a semiconductor carrier disposed below may also be more easily picked up. For example, it may be possible to pick up, from an upper transfer port, a semiconductor carrier that is transferred by an overhead hoist transport (OHT) and also to pick up, from a lower transfer port, a semiconductor carrier that is transferred by an automated guided vehicle (AGV). Thus, one internal carrier shuttle may promptly pick up and store semiconductor carriers that are transferred through various pathways.

Figure 19:
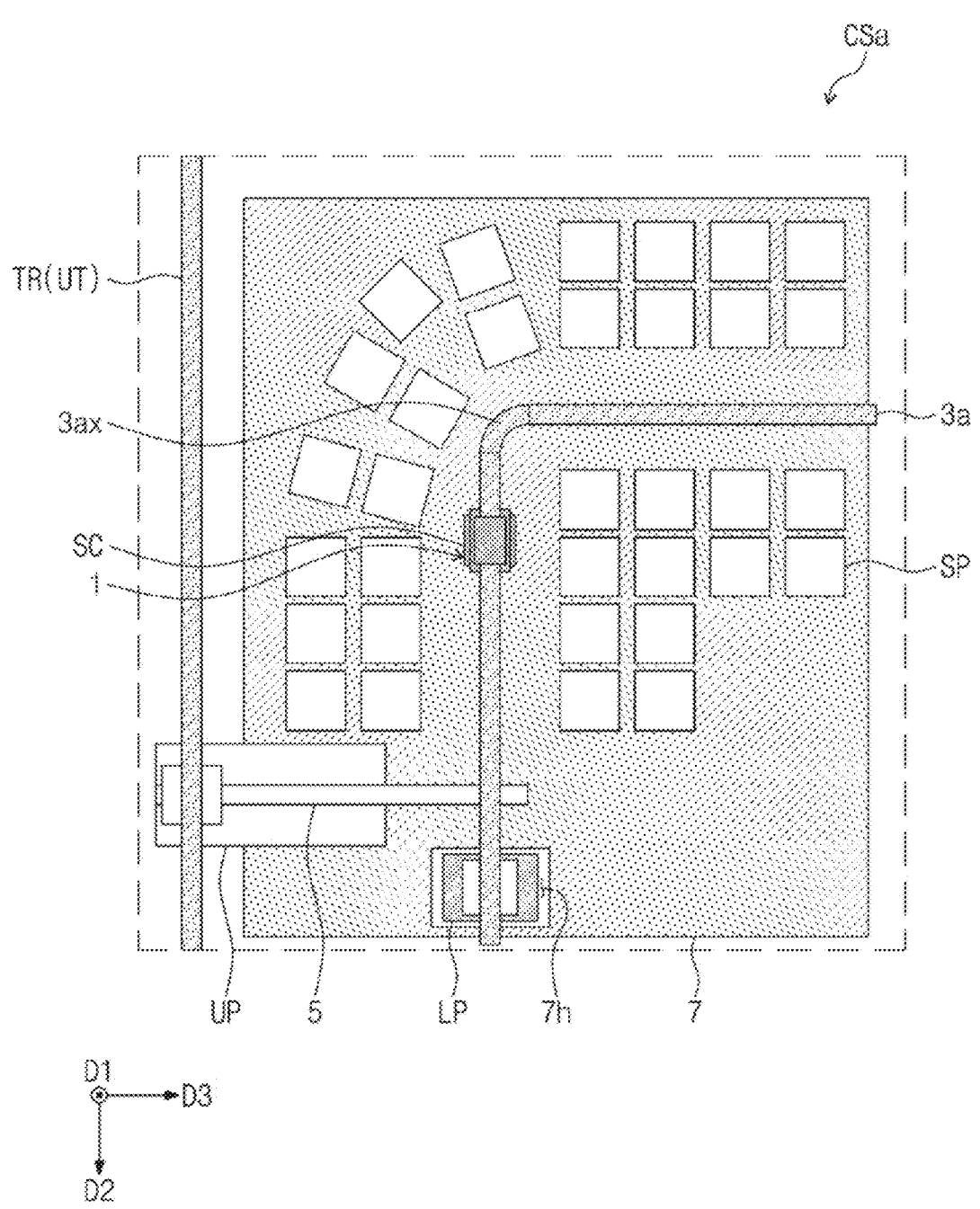
FIG. 19 illustrates a plan view showing a semiconductor carrier storage system according to some example embodiments of inventive concepts.

FIG. 19 illustrates a plan view showing a semiconductor carrier storage system according to various example embodiments of inventive concepts.

The following will omit description of components substantially the same as or similar to those discussed with reference to FIGS. 1 to 18.

Referring to FIG. 19, a semiconductor carrier storage system CSa may be provided. Differently from the description with reference to FIG. 2, a shuttle rail 3a of the semiconductor carrier storage system CSa may have a curved shape when viewed in plan. For example, the shuttle rail 3a may include a curved section 3ax.

A plurality of storage ports SP may be disposed in a curved shape along the shuttle rail 3a. For example, the plurality of storage ports SP may be arranged in a curved shape when viewed in plan.

It is described above that the shuttle rail 3a has a shape that is vertically curved once, but inventive concepts are not limited thereto. For example, the shuttle rail 3a may have a circular shape when viewed in plan. For another example, the shuttle rail 3a may have any other suitable shape. Therefore, the plurality of storage ports SP may also be disposed in various ways.

According to a semiconductor carrier storage system, a semiconductor fabrication system including the same, and a semiconductor fabrication method using the same in accordance with some example embodiments of inventive concepts, a plurality of storage ports may be arranged in a curved shape when viewed in plan. Alternatively or additionally, a shuttle rail may also have a curved shape. As an internal carrier shuttle is coupled through a transfer wheel to the shuttle rail, even when the shuttle rail has a curved shape, the internal carrier shuttle may favorably move along the shuttle rail. Therefore, even though the plurality of storage ports is disposed in various ways, it may be possible to achieve satisfactory internal transfer. The plurality of storage ports may thus be freely disposed in accordance with shape of an idle space. In this case, even when the idle space is narrow, a semiconductor carrier storage system may be installed. Therefore, space usability may increase.

According to a semiconductor carrier storage system, a semiconductor fabrication system including the same, and a semiconductor fabrication method using the same in accordance with inventive concepts, it may be possible to store semiconductor carriers by utilizing a variously shaped idle space in semiconductor fabrication line.

According to a semiconductor carrier storage system, a semiconductor fabrication system including the same, and a semiconductor fabrication method using the same in accordance with inventive concepts, it may be possible to pick up and store semiconductor carriers that are transferred in various pathways.

According to a semiconductor carrier storage system, a semiconductor fabrication system including the same, and a semiconductor fabrication method using the same in accordance with inventive concepts, it may be possible to reduce cost.

According to a semiconductor carrier storage system, a semiconductor fabrication system including the same, and a semiconductor fabrication method using the same in accordance with inventive concepts, it may be possible not only to reduce a transfer time of semiconductor carriers, but to store a great number of semiconductor carriers.

Effects of inventive concepts are not limited to the mentioned above, other effects which have not been mentioned above will be clearly understood to those skilled in the art from the following description.

Although inventive concepts have been described in connection with the embodiments of inventive concepts illustrated in the accompanying drawings, it will be understood to those skilled in the art that various changes and modifications may be made without departing from the technical spirit and essential feature of inventive concepts. It therefore will be understood that the embodiments described above are just illustrative but not limitative in all aspects. Furthermore example embodiments are not necessarily mutually exclusive with one another. For example, some example embodiments may include one or more features described with reference to one or more figures, and may also include one or more other figures described with reference to one or more other figures.

What is claimed is:

1. A semiconductor carrier storage system, comprising:
a plurality of storage ports each of which is configured to accommodate a semiconductor carrier;
a shuttle rail that extends in a horizontal direction on a side of the plurality of storage ports and relative to a ground;
an internal carrier shuttle configured to move along the shuttle rail and to transfer the semiconductor carrier to at least one of the plurality of storage ports;
an upper transfer port configured to receive the semiconductor carrier from an overhead hoist transport (OHT), the upper transfer port (i) extending in a direction that intersects with the shuttle rail and (ii) overlapping with the shuttle rail in plan view, and
an internal transfer device that extends in a direction that intersects the horizontal direction and that is configured to move and transfer the semiconductor carrier on the upper transfer port to a location below the shuttle rail,
wherein the internal carrier shuttle includes:
a shuttle body configured to couple to the shuttle rail;
a transfer wheel configured to connect the shuttle body to the shuttle rail;
a gripper configured to hold the semiconductor carrier; and
a hoist configured to vertically extend between the shuttle body and the gripper and to drive the gripper to vertically move, and
wherein, the internal carrier shuttle is configured to, based on the internal carrier shuttle moving along the shuttle rail in the horizontal direction to a first position, pick up the semiconductor carrier that has been received by the upper transfer port and transferred to the internal transfer device, and wherein, the internal carrier shuttle is configured to, based on the internal carrier shuttle moving along the shuttle rail in the horizontal direction to a second position, transfer the semiconductor carrier, that has been received by the upper transfer port and transferred to the internal transfer device, to at least one of the plurality of storage ports.

2. The system of claim 1, wherein the plurality of storage ports are arranged in the horizontal direction.

3. The system of claim 2, wherein the plurality of storage ports are arranged in a curved shape when viewed in plan, and the shuttle rail includes a section that is curved along the plurality of storage ports.

4. The system of claim 1, wherein the plurality of storage ports are arranged in:

a first row wherein ones of the plurality of storage ports are arranged in the horizontal direction; and a second row where others of the plurality of storage ports are arranged in the horizontal direction, wherein the second row is on the first row.

5. The system of claim 1, further comprising:

a lower transfer port arranged below the plurality of storage ports and configured to receive the semiconductor carrier from at least one of an automated guided vehicle (AGV) or an autonomous mobile robot (AMR).

6. The system of claim 5, further comprising:

a lower plate below the plurality of storage ports, wherein the lower transfer port is lower than the lower plate, wherein the lower plate defines a carrier movement hole that vertically penetrates the lower plate, and wherein the carrier movement hole is on the lower transfer port.

7. The system of claim 1, wherein the upper transfer port and the shuttle rail are spaced apart from each other in the horizontal direction, and wherein a first side of the internal transfer device is connected to the upper transfer port and a second side of the internal transfer device is below the shuttle rail.

8. A semiconductor fabrication system, comprising:

a semiconductor process chamber;

a transfer system configured to transfer a semiconductor carrier to the semiconductor process chamber; and a semiconductor carrier storage system configured to store the semiconductor carrier transferred from the transfer system, wherein the semiconductor carrier storage system includes:

a plurality of storage ports each of which is configured to accommodate a semiconductor carrier;

a shuttle rail that extends in a horizontal direction on a side of the plurality of storage ports and relative to a ground;

an internal carrier shuttle configured to move along the shuttle rail and to transfer the semiconductor carrier to at least one of the plurality of storage ports;

an upper transfer port configured to receive the semiconductor carrier from an overhead hoist transport (OHT), the upper transfer port (i) extending in a direction that intersects with the shuttle rail and (ii) overlapping with the shuttle rail in plan view;

an internal transfer device that extends in a direction that intersects the horizontal direction and that is configured to move and transfer the semiconductor carrier on the upper transfer port to a location below the shuttle rail, and a lower transfer port below the plurality of storage ports and configured to receive the semiconductor carrier from the transfer system, wherein the internal carrier shuttle includes:

a shuttle body configured to couple to the shuttle rail;

a transfer wheel configured to connect the shuttle body to the shuttle rail;

a gripper configured to hold the semiconductor carrier; and a hoist configured to vertically extend between the shuttle body and the gripper and to drive the gripper to vertically move, wherein, the internal carrier shuttle is configured to, based on the internal carrier shuttle moving along the shuttle rail in the horizontal direction to a first position, pick up the semiconductor carrier that has been received by the upper transfer port and transferred to the internal transfer device, and wherein, the internal carrier shuttle is configured to, based on the internal carrier shuttle moving along the shuttle rail in the horizontal direction to a second position, transfer the semiconductor carrier, that has been received by the upper transfer port and transferred to the internal transfer device, to at least one of the plurality of storage ports.

9. The system of claim 8, wherein the transfer system includes:

an upper transport coupled to a ceiling; and a lower transport on a floor, wherein the upper transport includes:

a transport rail spaced apart from the shuttle rail; and the OHT coupled to the transport rail and configured to move along the transport rail, wherein the upper transfer port is below the transport rail and is configured to receive the semiconductor carrier from the OHT.

10. The system of claim 9, wherein one side of the internal transfer device is connected to the upper transfer port, and another side of the internal transfer device is below the shuttle rail.

11. The system of claim 9, wherein the lower transport includes at least one of an automated guided vehicle (AGV) or an autonomous mobile robot (AMR), wherein the lower transfer port is on the floor and is configured to receive the semiconductor carrier from the AGV or the AMR.

12. The system of claim 11, wherein the semiconductor carrier storage system further includes a lower plate below the plurality of storage ports, the lower plate defines a carrier movement hole disposed on the lower transfer port.

13. A semiconductor fabrication method, comprising:

using a transfer system to pick up a semiconductor carrier from a semiconductor process chamber and load the semiconductor carrier on a semiconductor carrier storage system, wherein the semiconductor carrier storage system comprises:

a plurality of storage ports each of which is configured to accommodate a semiconductor carrier;

a shuttle rail that extends in a horizontal direction on a side of the plurality of storage ports and relative to a ground;

an internal carrier shuttle configured to move along the shuttle rail and to transfer the semiconductor carrier to at least one of the plurality of storage ports;

an upper transfer port configured to receive the semiconductor carrier from an overhead hoist transport (OHT), the upper transfer port (i) extending in a direction that intersects with the shuttle rail and (ii) overlapping with the shuttle rail in plan view, and an internal transfer device that extends in a direction that intersects the horizontal direction and that is configured to move and transfer the semiconductor carrier on the upper transfer port to a location below the shuttle rail, wherein the internal carrier shuttle includes:

a shuttle body configured to couple to the shuttle rail;

a transfer wheel configured to connect the shuttle body to the shuttle rail;

a gripper configured to hold the semiconductor carrier; and a hoist configured to vertically extend between the shuttle body and the gripper and to drive the gripper to vertically move, and wherein, the internal carrier shuttle is configured to, based on the internal carrier shuttle moving along the shuttle rail in the horizontal direction to a first position, pick up the semiconductor carrier that has been received by the upper transfer port and transferred to the internal transfer device, and wherein, the internal carrier shuttle is configured to, based on the internal carrier shuttle moving along the shuttle rail in the horizontal direction to a second position, transfer the semiconductor carrier, that has been received by the upper transfer port and transferred to the internal transfer device, to at least one of the plurality of storage ports;

using the internal carrier shuttle of the semiconductor carrier storage system to pick up the semiconductor carrier; and causing the internal carrier shuttle to move along a shuttle rail and to place the semiconductor carrier on a storage port of the semiconductor carrier storage system, wherein using the internal carrier shuttle to pick up the semiconductor carrier includes:

using the hoist of the internal carrier shuttle to cause a gripper to descend from a shuttle body;

using the descended gripper to hold the semiconductor carrier; and ascending the gripper that holds the semiconductor carrier.

14. The method of claim 13, wherein using the transfer system to pick up the semiconductor carrier from the semiconductor process chamber includes:

using an upper transport coupled a ceiling to pick up the semiconductor carrier from a process port of the semiconductor process chamber; and using a lower transport on a floor to pick up the semiconductor carrier from the process port of the semiconductor process chamber.

15. The method of claim 14, wherein using the upper transport to pick up the semiconductor carrier from the process port of the semiconductor process chamber includes using the OHT of the upper transport to pick up the semiconductor carrier on the process port, and wherein loading the semiconductor carrier on the semiconductor carrier storage system includes using the OHT to load the semiconductor carrier on the upper transfer port that is spaced apart in the horizontal direction from the shuttle rail.

16. The method of claim 15, further comprising:

causing the semiconductor carrier loaded on the upper transfer port to move in the horizontal direction to rest on a location below the shuttle rail.

17. The method of claim 14, wherein using the lower transport to pick up the semiconductor carrier from the process port of the semiconductor process chamber includes using at least one of an automated guided vehicle (AGV) or an autonomous mobile robot (AMR) to pick up the semiconductor carrier on the process port, and loading the semiconductor carrier on the semiconductor carrier storage system includes using the AGV or the AMR to load the semiconductor carrier on a lower transfer port positioned below the plurality of storage ports.

* * * * *